United States Patent
Koyama et al.

(10) Patent No.: US 9,348,225 B2
(45) Date of Patent: May 24, 2016

(54) LITHOGRAPHIC PRINTING PLATE PRECURSORS AND PROCESSES FOR PREPARING LITHOGRAPHIC PRINTING PLATES

(71) Applicant: FUJIFILM Corporation, Minato-ku, Tokyo (JP)

(72) Inventors: Ichiro Koyama, Haibara-gun (JP); Junya Abe, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/467,613

(22) Filed: Aug. 25, 2014

(65) Prior Publication Data

US 2014/0377705 A1 Dec. 25, 2014

Related U.S. Application Data

(63) Continuation of application No. PCT/JP2013/053616, filed on Feb. 15, 2013.

(30) Foreign Application Priority Data

Feb. 27, 2012 (JP) ................................ 2012-040056

(51) Int. Cl.
G03F 7/11 (2006.01)
G03F 7/038 (2006.01)
C08F 290/12 (2006.01)
C08F 299/06 (2006.01)
G03F 7/027 (2006.01)
G03F 7/38 (2006.01)
B41C 1/10 (2006.01)
G03F 7/033 (2006.01)
G03F 7/30 (2006.01)
G03F 7/32 (2006.01)
G03F 7/20 (2006.01)
C08F 265/06 (2006.01)

(52) U.S. Cl.
CPC ............ G03F 7/0388 (2013.01); B41C 1/1008 (2013.01); C08F 265/06 (2013.01); C08F290/12 (2013.01); C08F 299/06 (2013.01); G03F 7/027 (2013.01); G03F 7/033 (2013.01); G03F 7/20 (2013.01); G03F 7/3035 (2013.01); G03F 7/322 (2013.01); G03F 7/38 (2013.01); B41C 1/1016 (2013.01); B41C 2201/02 (2013.01); B41C 2210/04 (2013.01); B41C 2210/06 (2013.01); B41C 2210/10 (2013.01); B41C 2210/24 (2013.01)

(58) Field of Classification Search
USPC .............................................. 430/270.1, 302
See application file for complete search history.

(56) References Cited

U.S. PATENT DOCUMENTS

| 2006/0166137 A1* | 7/2006 | Mitsumoto et al. ........ 430/270.1 |
| 2007/0218404 A1* | 9/2007 | Watanabe ................ B41N 1/08 430/270.1 |
| 2011/0020751 A1* | 1/2011 | Taguchi et al. ............... 430/302 |

FOREIGN PATENT DOCUMENTS

| EP | 2 259 137 A1 | 12/2010 |
| EP | 2 367 056 A2 | 9/2011 |
| EP | 2367056 A2 * | 9/2011 |
| EP | 2 378 361 A1 | 10/2011 |
| JP | 2009-258719 A | 11/2009 |
| JP | 2011-191558 A | 9/2011 |
| JP | 2011-221522 A | 11/2011 |

OTHER PUBLICATIONS

International Search Report for PCT/JP2013/053616 dated Mar. 19, 2013.
Office Action from the Japanese Patent Office issued Sep. 2, 2014 in a counterpart Japanese Patent Application No. 2012-040056.
International Preliminary Report on Patentability dated Sep. 12, 2014, issued by the International Bureau in corresponding International Application No. PCT/JP2013/053616.
Extended European Search Report dated Sep. 4, 2015 from the European Patent Office in corresponding European Application No. 13754776.6.

* cited by examiner

*Primary Examiner* — Chanceity Robinson
(74) *Attorney, Agent, or Firm* — Sughrue Mion, PLLC

(57) ABSTRACT

Disclosed is a lithographic printing plate allowing for high running performance of the developer, wide water window and high printing durability. The lithographic printing plate precursor comprises a photosensitive layer on a support, wherein the photosensitive layer comprises (A) a polymerizable compound, (B) a polymerization initiator, (C) a polyvinyl acetal binder containing at least one kind of repeat units represented by general formula (I-c), general formula (I-b) and general formula (I-a), and (D) an acrylic resin binder.

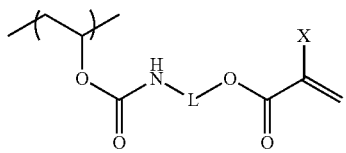

(I-c)

-continued

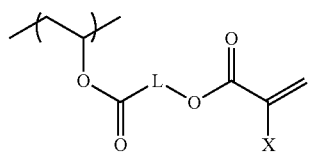
(I-b)

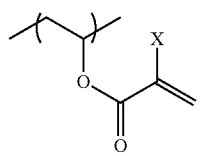

(I-a)

20 Claims, 2 Drawing Sheets

LITHOGRAPHIC PRINTING PLATE PRECURSORS AND PROCESSES FOR PREPARING LITHOGRAPHIC PRINTING PLATES

CROSS-REFERENCE TO RELATED APPLICATIONS

This application is a Continuation of PCT International Application No. PCT/JP2013/53616 filed on Feb. 15, 2013, which claims priority under 35 U.S.C §119(a) to Japanese Patent Application No. 2012-040056, filed on Feb. 27, 2012. The above application is hereby expressly incorporated by reference, in its entirety, into the present application.

The present invention relates to a lithographic printing plate precursor and a method of manufacturing lithographic printing plate, according to which a printing plate is directly manufacturable based on digital signal output from a computer or the like using various types of laser, the technique being so-called direct plate making, and particularly to a lithographic printing plate precursor and a method of manufacturing planographic a printing plate suitable for simplified processes.

DESCRIPTION OF THE RELATED ART

Solid-state laser, semiconductor laser, and gas laser capable of emitting ultraviolet radiation, visible light and infrared radiation, over a wavelength range of 300 nm to 1200 nm, have been becoming more readily available in larger output and smaller size, and these types of laser are very important as recording light sources in direct plate making process using digital data output from a computer or the like. Various recording materials sensitive to these types of laser light have been investigated. The first category of the materials are those adaptive to infrared laser recording at an image recording wavelength of 760 nm or longer, which are exemplified by positive recording material (Patent Document 1), and negative recording material causing acid-catalyzed crosslinking (Patent Document 2). The second category of the materials are those adoptive to ultraviolet or visible light laser recording over the wavelength range from 300 nm to 700 nm, which are exemplified by radical-polymerizable negative recording material (Patent Document 3, Patent Document 4).

The conventional lithographic printing plate precursor (also referred to as "PS plate", hereinafter) have essentially needed, after exposure for image forming, a process of solubilizing and removing the non-image-forming area using an aqueous strong alkaline solution (development process), and have also needed water washing of the developed printing plate, rinsing with a rinsing solution containing a surfactant, and post-treatment such as using a desensitization solution containing gum arabic or a starch derivative. Indispensableness of these additional wet processes has been a big issue of the conventional PS plate. This is because, even if the former half of the plate making process (pattern-wise exposure) may be simplified by virtue of digital processing, the effect of simplification is limitative so long as the latter half (development process) relies upon such labor-consuming wet process.

In particular in recent years, friendliness to the global environment has been a great matter of interest across the whole area of industry, so that issues to be solved from the environmental viewpoint include use of a developer more close to neutral, and reduction in volume of waste liquid. Among others, the wet post-treatment have been desired to be simplified, or replaced with a dry process.

From this point of view, there has been known methods of simplifying the post-treatment process, exemplified by single-liquid treatment or single-bath treatment, by which development and gum solution are proceeded at the same time. More specifically, they belong to a sort of simplified development process by which the original plate is exposed pattern-wise without pre-water washing; removal of a protective layer, removal of the non-image-forming area, and coating of gum solution are implemented concomitantly using a single solution or in a single bath; the original plate is dried without post-water washing, and then put into the printing process. The lithographic printing plate precursor suitable for this sort of simplified development, implemented without the post-water washing, necessarily has a photosensitive layer soluble into a process solution not so strongly alkaline, and the support thereof necessarily has a hydrophilic surface in view of improving staining resistance of the non-image-forming area. However, it was practically impossible to achieve high printing durability and chemical resistance with conventional PS plates while satisfying such requirements.

One approach for simplifying process steps is a method called on-press development by which exposed lithographic printing plate precursors are mounted on a cylinder of a printing press and supplied with a dampening water and an ink while the cylinder is rotated to remove non-image areas of the lithographic printing plate precursors. In other words, lithographic printing plate precursors are mounted on a printing press directly after they are image-exposed so that development is completed during the normal printing process.

Lithographic printing plate precursors suitable for such on-press development are required to have not only an image-forming layer soluble in dampening waters and ink solvents but also lightroom handling suitability for development on a printing press in a lightroom. However, it was practically impossible to sufficiently satisfy such requirements with conventional PS plates.

To satisfy such requirements, lithographic printing plate precursors comprising a photosensitive layer containing thermoplastic hydrophobic polymer microparticles dispersed in a hydrophilic binder polymer on a hydrophilic substrate were proposed (see e.g., Patent Document 7). They were converted into plates by exposing them to an infrared laser to form an image with the thermoplastic hydrophobic polymer microparticles coalesced (fused together) by the heat generated by opto-thermal conversion and then mounting them on a cylinder of a printing press and supplying at least any one of a dampening water and an ink to develop the image on press. The lithographic printing plate precursors are also suitable for handling in a lightroom because the image is recorded in the infrared region.

However, the image formed by coalescing (fusing together) the thermoplastic hydrophobic polymer microparticles is insufficient in fastness so that the resulting lithographic printing plates are disadvantageous in printing durability.

On the other hand, lithographic printing plate precursors comprising microcapsules incorporating a polymerizable compound instead of thermoplastic microparticles were proposed (see e.g., Patent Document 8, Patent Document 9, Patent Document 10, Patent Document 11, Patent Document 12, and Patent Document 13). The lithographic printing plate precursors according to such proposals have the advantage that the polymer images formed by a reaction of the polymerizable compound are superior in fastness to the images formed by coalescence of microparticles.

Further, it has often been proposed to isolate the polymerizable compound by using microcapsules because it is highly reactive. Moreover, it has been proposed to use thermodegradable polymers for the shells of the microcapsules.

However, the conventional lithographic printing plate precursors described in Patent Documents 7 to 13 are insufficient in the printing durability of the images formed by laser exposure and should be further improved. Thus, substrates having highly hydrophilic surfaces were used in these easy-to-handle lithographic printing plate precursors, with the result that image areas were readily separated from the substrates with dampening waters during printing and sufficient printing durability could not be attained. If the substrate surfaces are hydrophobic, however, inks also deposit on non-image areas during printing to cause print staining. Thus, it is very difficult to improve both printing durability and staining resistance, and any lithographic printing plate precursor suitable for on-press-development with good staining resistance and sufficient printing durability has not been known.

On the other hand, lithographic printing plate precursors comprising a hydrophilic layer with high adhesion to substrate surfaces to improve both printing durability and staining resistance have been known. For example, Patent Document 14 discloses a substrate for lithographic printing plates comprising a hydrophilic layer composed of a polymer compound directly chemically bound to the surface of the substrate and having a hydrophilic functional group on the substrate. Patent Document 15 and Patent Document 16 disclose substrates for lithographic printing plates comprising an aluminum substrate or silicated aluminum substrate having a hydrophilic surface to which is chemically bound a hydrophilic polymer having a reactive group capable of being chemically bound to the substrate surface directly or through a moiety having a crosslinking structure. Patent Document 17 discloses a lithographic printing plate precursor comprising a photosensitive layer containing a polymerization initiator, a polymerizable compound, and a binder polymer soluble or swellable in water or aqueous alkaline solutions on a substrate, wherein the photosensitive layer or an extra layer contains a copolymer comprising a repeating unitrepeating unit having at least one ethylenically unsaturated bond and a repeating unitrepeating unit having at least one functional group interacting with the substrate surface. Patent Document 18 discloses a lithographic printing plate precursor comprising a substrate, a hydrophilic layer formed of a hydrophilic polymer chemically bound to the surface of the substrate and an image-forming layer in order, wherein the hydrophilic polymer comprises at least one of a reactive group capable of being directly chemically bound to the surface of the substrate and a reactive group capable of being chemically bound to the surface of the substrate through a crosslinking structure and a positively and negatively charged substructure.

On the other hand, there have recently been demands for improving chemical resistance, scratch resistance and ink adhesion in the printing process while striking a balance among them at a high level. However, it is very difficult to satisfy these demands by single bath processes or on-press development due to the lack of the step of protecting the plate surface after development. To achieve a balance among them, lithographic printing plates using polyvinyl butyral and an acrylic binder in image areas have been proposed (e.g., see patent document 19).

REFERENCES

Patent Documents

Patent document 1: U.S. Pat. No. 4,708,925
Patent document 2: JP-A-H8-276558
Patent document 3: U.S. Pat. No. 2,850,445
Patent document 4: JP-B-S44-20189
Patent document 7: Japanese Patent No. 2938397
Patent document 8: JP-A2000-211262
Patent document 9: JP-A2001-277740
Patent document 10: JP-A2002-29162
Patent document 11: JP-A2002-46361
Patent document 12: JP-A2002-137562
Patent document 13: JP-A2002-326470
Patent document 14: JP-A2001-166491
Patent document 15: JP-A2003-63166
Patent document 16: JP-A2004-276603
Patent document 17: JP-A2008-213177
Patent document 18: JP-A2007-118579
Patent document 19: JP-A2009-516222

SUMMARY OF THE INVENTION

Problems to be Solved by the Invention

Besides the properties described above, printing plate precursors are essentially required to allow for a long replacement interval of the developer (or the dampening water in cases of on-press development) during its continuous use (i.e., high running performance of the developer) in the developing as well as a wide range of printing conditions under which stable image quality can be obtained in the printing. With this in mind, we examined the lithographic printing plate precursors described in patent document 19 to find that the running performance of the developer and the width of the range of feed levels of the dampening water that can be applied during printing (i.e., water window) were still insufficient. In the developing, residues of developed non-image areas deposited in the developer so that the replacement interval of the developer was significantly shortened. On the other hand, it was very difficult to control the feed level of the dampening water to obtain good images in the printing because the feed level of the dampening water had a great influence on ink adhesion.

One of factors of the above problems was found to lie in the low compatibility of polyvinyl butyral with the acrylic binder. However, mere attempts to improve compatibility did not lead to sufficient strength in image areas, but impaired printing durability.

Accordingly, an object of the present invention is to provide lithographic printing plate precursors that can be converted into lithographic printing plates allowing for high running performance of the developer, wide water window and high printing durability as well as processes for preparing such lithographic printing plates.

Means to Solve the Problems

As a result of careful studies, we found that the above problems can be solved by combining an acrylic resin with a polyvinyl acetal resin containing a specific repeat unit.

Thus, we succeeded in solving these problems on the findings below.

We found that if conventional polyvinyl acetal resins were used as binders, the hydroxyl groups present in the resins aggregate to form a path for water penetration. Thus, image areas were wetted during printing under conditions of high moisture content, resulting in poor ink adhesion. Even if crosslinkable groups were attached to the polyvinyl acetal resins, this problem could not be solved because the hydroxyl group moieties aggregated. If acrylic resins were used alone as binders, however, residues generated during development were more likely to aggregate and deposit in the developing machine, whereby the running performance of the developer decreased. Further, it was found that even if a polyvinyl acetal resin and an acrylic resin were blended, the polymers separated in the photosensitive layer due to the low compatibility between them, whereby both of the above problems occurred simultaneously.

It was now found that when a (meth)acryloyl group is introduced into the polyvinyl acetal resin, the compatibility between the polyvinyl acetal resin and the acrylic resin is improved and the polyvinyl acetal resin and the acrylic resin are homogenized. In this case, the hydroxyl groups in the polyvinyl butyral resin interact with the acrylic resin so that they are less likely to aggregate. When crosslinking is induced by exposure to light in this state, the hydroxyl groups in the polyvinyl butyral resin in image areas are fixed in the image areas together with the acrylic resin, whereby the image areas are not wetted and good ink adhesion can be achieved even during printing under conditions of high moisture content. On the other hand, residues are fragmented and less likely to deposit in the developer because the acrylic resin is dispersed by the polyvinyl butyral resin in non-image areas. The results showed that the running performance of the developer improves.

Specifically, the problems were solved by the configuration below.

<1> A lithographic printing plate precursor comprising a photopolymerizable layer on a support, wherein the photopolymerizable layer comprises (A) a polymerizable compound, (B) a polymerization initiator, (C) a polyvinyl acetal binder containing at least one kind of repeat units represented by general formula (I-c), general formula (I-b) and general formula (I-a), and (D) a binder containing an acrylic resin;

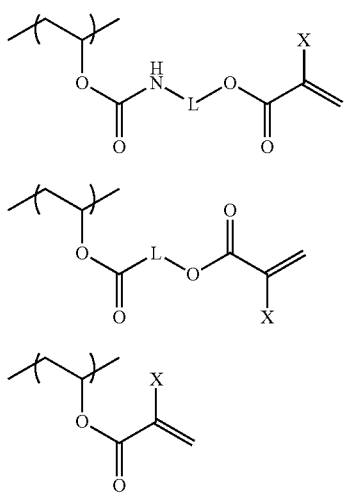

in the formulae above, X each represents a hydrogen atom or a methyl group, and L each represents a divalent linking group.

<2> The lithographic printing plate precursor according to <1>, wherein the binder (C) is a polyvinyl acetal binder containing at least one kind of repeat units represented by any one of general formula (II), general formula (III), general formula (IV) and general formula (V) below;

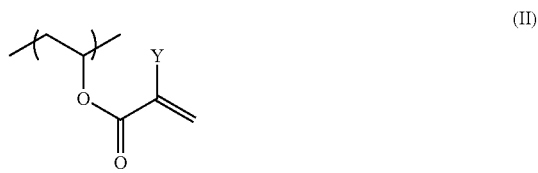

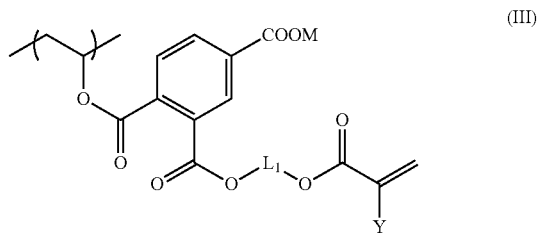

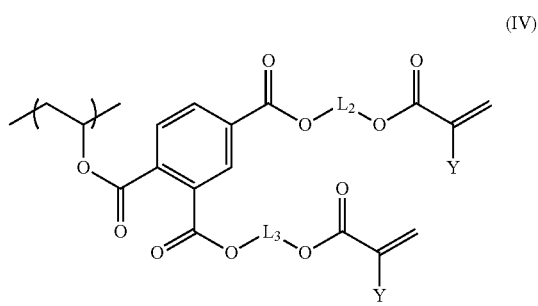

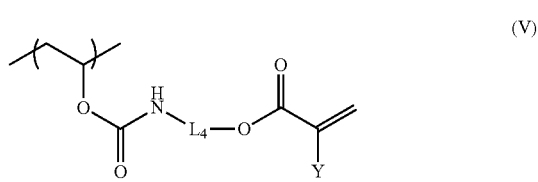

in the formulae above, Y each represents a hydrogen atom or a methyl group, M represents a hydrogen atom, a lithium atom, a sodium atom or a potassium atom, and $L^1$ to $L^4$ each represent an optionally substituted alkyl group, an optionally substituted alkylene group, or an optionally substituted aryl group.

<3> The lithographic printing plate precursor according to <1> or <2>, wherein the polymerizable compound (A) contains a urethane bond.

<4> The lithographic printing plate precursor according to any one of <1> to <3>, wherein the polymerizable compound (A) further contains a urea bond.

<5> The lithographic printing plate precursor according to <1> or <2>, wherein the polymerizable compound (A) is a (meth)acrylate containing a urethane bond and/or urea bond.

<6> The lithographic printing plate precursor according to any one of <1> to <5>, wherein the polymerizable compound (A) is a polyfunctional compound.

<7> The lithographic printing plate precursor according to <1> or <2>, wherein at least one of the polymerizable compound (A) is a compound represented by the formula below;

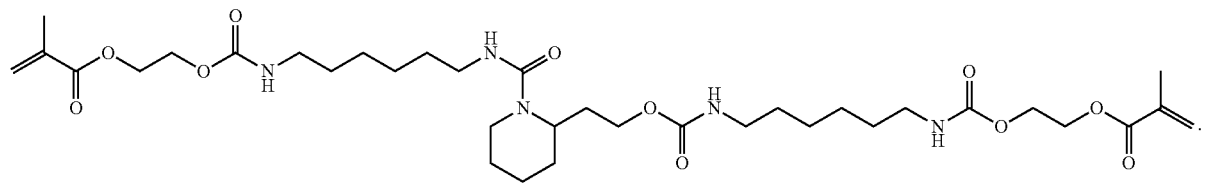 [SMILES: C=C(C)C(=O)OCCOC(=O)NCCCCCCNC(=O)OCCC1CCCCN1C(=O)NCCCCCCNC(=O)OCCOC(=O)C(=C)C]

<8> The lithographic printing plate precursor according to any one of <1> to <7>, wherein the polyvinyl acetal binder is a polyvinyl acetal binder containing at least one kind of repeat units represented by general formula (I-c), general formula (I-b) and general formula (I-a), the repeat units (1) to (3) shown below and an acid group;

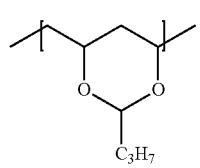

(1)

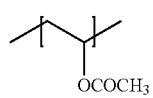

(2)

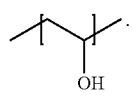

(3)

<9> A process for preparing a lithographic printing plate, comprising: imagewise exposing a lithographic printing plate precursor according to any one of <1> to <8>; and developing the exposed lithographic printing plate precursor in the presence of a developer at pH 2 to 14 to remove the photosensitive layer in non-exposed areas.

<10> The process for preparing a lithographic printing plate according to <9>, wherein the exposing comprises heating the exposed precursor at a temperature of 80° C. or more in a preheating unit.

<11> The process for preparing a lithographic printing plate according to <9> or <10>, wherein the developing comprises removing the photosensitive layer in non-exposed areas and the protective layer simultaneously in the presence of the developer further containing a surfactant provided that no water-washing is included.

<12> The process for preparing a lithographic printing plate according to any one of <9> to <11>, comprising controlling the pH of the developer at 2.0 to 10.0.

<13> A process for preparing a lithographic printing plate, comprising: imagewise exposing a lithographic printing plate precursor according to any one of claims 1 to 8; and supplying a printing ink and a dampening water to remove the photosensitive layer in non-exposed areas on a printing press.

Advantages of the Invention

The features of the present invention make it possible to provide lithographic printing plate precursors that can be converted into lithographic printing plates allowing for high running performance of the developer, wide water window and high printing durability as well as processes for preparing such lithographic printing plates.

THE BEST MODES FOR CARRYING OUT THE INVENTION

Figure 1:
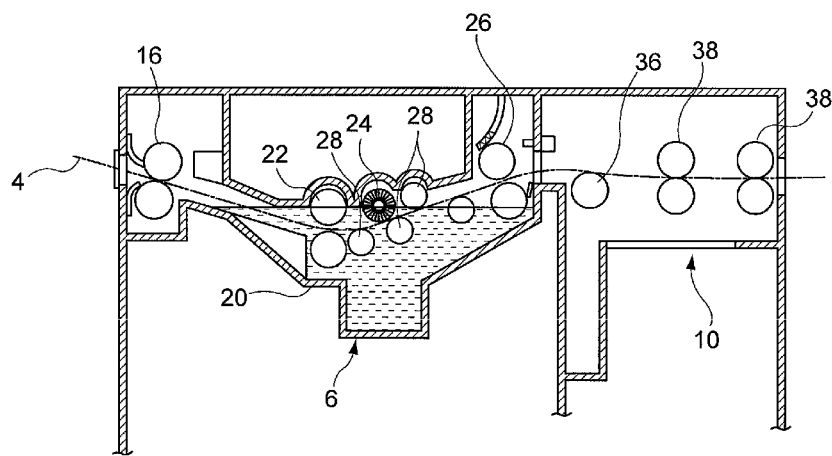
FIG. 1 is an explanatory drawing illustrating an exemplary configuration of an automatic processor.

The present invention will be explained in detail below. The description of essential features below may be sometimes based on representative embodiments of the present invention, but the present invention is not limited to such embodiments. As used herein, the numerical ranges expressed with "to" are used to mean the ranges including the values indicated before and after "to" as lower and upper limits.

As used herein, any reference to a group in a compound represented by a formula without indicating that the group is substituted or unsubstituted includes the group not only unsubstituted but also substituted if the group may be further substituted, unless otherwise specified. For example, the reference in a formula that "R represents alkyl, aryl or heterocyclyl" means that "R represents unsubstituted alkyl, substituted alkyl, unsubstituted aryl, substituted aryl, unsubstituted heterocyclyl or substituted heterocyclyl". As used herein, "(meth)acryl" refers to the concept including both methacryl and acryl.

[Lithographic Printing Plate Precursors]

The lithographic printing plate precursors of the present invention are explained in detail below. The lithographic printing plate precursors of the present invention comprise a photopolymerizable layer on a support, characterized in that the photopolymerizable layer comprises (A) a polymerizable compound, (B) a polymerization initiator, (C) a polyvinyl acetal binder containing at least one kind of repeat units represented by general formula (I-c), general formula (I-b) and general formula (I-a) (hereinafter sometimes referred to as "specific polyvinyl acetal binder"), and (D) a binder containing an acrylic resin.

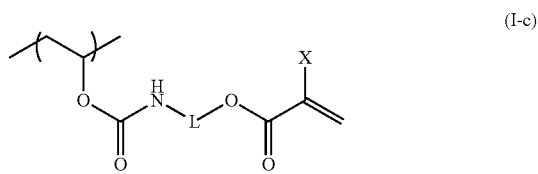

(I-c)

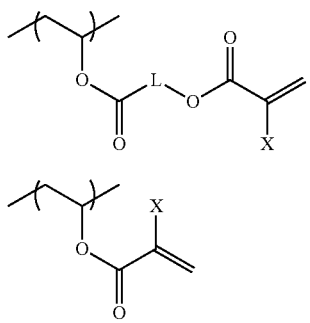

In the formulae above, X each represents a hydrogen atom or a methyl group, and L each represents a divalent linking group.

Preferably, the lithographic printing plate precursor of the present invention can be directly converted into a plate using various lasers from digital signals of computers or the like, i.e., it is applicable to so-called computer-to-plate. Preferably, it can also be developed in aqueous solutions at pH 2.0 to 10.0 or less or on a printing press.

Preferred embodiments of the lithographic printing plate precursors of the present invention are explained in detail below.

The lithographic printing plate precursors of the present invention comprise a support and a photosensitive layer provided on the support. Further, the lithographic printing plate precursors of the present invention may optionally comprise a primer layer as an intermediate layer between the support and the photosensitive layer. Furthermore, the lithographic printing plate precursors of the present invention may comprise other component layers. In the present invention, the support and the intermediate layer are preferably contiguous to each other, and more preferably the support, the intermediate layer and the photosensitive layer are contiguous to each other in this order. However, an additional intermediate layer (primer layer) may be provided between the support and the intermediate layer and between the intermediate layer and the photosensitive layer without departing from the spirit of the present invention. Preferably, the lithographic printing plate precursors of the present invention comprise a protective layer on the surface of the photosensitive layer opposite to the support. Further, the lithographic printing plate precursors of the present invention may comprise a back coating layer on the bottom of the support as appropriate.

To make it easy to understand how to form the lithographic printing plate precursors of the present invention, the support, intermediate layer, photosensitive layer, additional layer, protective layer, and back coating layer constituting the lithographic printing plate precursors of the present invention are explained below in order.

[Support]

The support used for the lithographic printing plate precursors of the present invention is not specifically limited, but may be any dimensionally stable hydrophilic support in the form of a plate. Especially, it is preferably an aluminum support.

Among aluminum supports, those subjected to surface treatments such as graining and anodization are preferred. Details about an aluminum support subjected to such surface treatments as graining and anodization are described in JP-A2009-516222 and WO 2007/057348, and reference can be made to these documents.

An acid is used for graining aluminum supports. The acid used for graining can be e.g. an acid comprising nitric acid, sulfuric acid, or hydrogen chloride, preferably an acid comprising hydrogen chloride. Also, mixtures of e.g. hydrogen chloride and acetic acid can be used.

Further, the relation between electrochemical graining and anodizing parameters such as electrode voltage, nature and concentration of the acid electrolyte or power consumption on the one hand and the obtained lithographic quality in terms of Ra and anodic weight ($g/m^2$ of $Al_2O_3$ formed on the aluminum surface) on the other hand has already been known, and more details can be found in e.g. the article "Management of Change in the Aluminium Printing Industry" by F. R. Mayers, published in the ATB Metallurgie Journal, volume 42 nr. 1-2 (2002) pag. 69.

The anodized aluminum support may be subjected to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. Further, the aluminum oxide surface may be rinsed with a bicarbonate solution. Still further, the aluminum oxide surface may be treated with polyvinylphosphonic acid, polyvinylmethylphosphonic acid, phosphoric acid esters of polyvinyl alcohols, polyvinylsulfonic acid, polyvinylbenzenesulfonic acid, sulfuric acid esters of polyvinyl alcohols, and acetals of polyvinyl alcohols produced by reaction with a sulfonated aliphatic aldehyde.

Another useful post-anodic treatment may be carried out with a solution of polyacrylic acid or a polymer comprising at least 30 mol % of acrylic acid monomeric units, e.g. GLASCOL E15, a polyacrylic acid commercially available from ALLIED COLLOIDS.

The grained and anodized aluminum support may be a sheet-like material such as a plate or it may be a cylindrical element such as a sleeve which can be slid around a print cylinder of a printing press.

Besides the surface treatments such as graining and anodization, the support may be subjected to e.g. mechanical surface-roughening treatments, electrochemical surface-roughening treatments (surface-roughening treatments by which surfaces are electrochemically dissolved), and chemical surface-roughening treatments (surface-roughening treatments by which surfaces are selectively chemically dissolved). For these treatments, the methods described in paragraphs [0241] to [0245] of JP-A2007-206217 can be preferably used.

Preferably, the support has a center line average roughness of 0.10 to 1.2 μm. When it is in this range, good adhesion to the photosensitive layer, good printing durability and good stain resistance can be obtained. Further, the support preferably has a color density of 0.15 to 0.65 expressed as reflection density. When it is in this range, halation is prevented during imagewise exposure, thereby providing good image-forming property and good visual inspection after development.

Preferably, the support has a thickness of 0.1 to 0.6 mm, more preferably 0.15 to 0.4 mm, even more preferably 0.2 to 0.3 mm.

The support can also be a flexible support provided with a hydrophilic layer (hereinafter also referred to as "base layer"). The flexible support is e.g. paper, plastic film or aluminum or the like. Preferred examples of plastic film include polyethylene terephthalate film, polyethylene naphthalate film, cellulose acetate film, polystyrene film, polycarbonate film, etc., and the plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetraalkyl orthosilicate. The latter is particularly preferred. The thickness of the hydrophilic base layer may vary in the range of 0.2 to 25 μm and is preferably 1 to 10 μm. More details of preferred embodiments of the base layer can be found in e.g. EP-A 1 025 992.

[The Support May be Hydrophilized or Provided with a Primer Layer]

In the lithographic printing plate precursors of the present invention, it is also preferred that the surface of the support is hydrophilized or a primer layer is provided between the support and the photosensitive layer to improve hydrophilicity and prevent print staining in non-image areas.

Methods of hydrophilization of the surface of the support include alkali metal silicate treatment by which the support is dipped into an aqueous solution of sodium silicate or the like, for electrolytic treatment; treatment using potassium fluorozirconate; and treatment using polyvinyl phosphonate. The method using an aqueous solution of polyvinyl phosphonate is preferably used.

The primer layer used is preferably a primer layer comprising a compound containing an acid group such as phosphonic acid, phosphoric acid, sulfonic acid or the like. Preferably, these compounds further contain a polymerizable group in order to improve adhesion to the photosensitive layer. Other preferred compounds include compounds containing a hydrophilicity-imparting group such as an ethylene oxide group or the like.

These compounds may be small molecules or high-molecular polymers. Preferred examples include the silane coupling agents having an addition-polymerizable reactive group containing an ethylenic double bond described in JP-A-H10-282679; the phosphorus compounds having a reactive group containing an ethylenic double bond described in JP-A-H2-304441; and the like.

The most preferred primer layers include those comprising a low molecular or high molecular compound having a crosslinkable group (preferably a group containing an ethylenically unsaturated bond), a functional group interacting with the surface of the support and a hydrophilic group described in JP-A2005-238816, JP-A2005-125749, JP-A2006-239867, and JP-A2006-215263.

Preferably, the coating mass of the primer layer is 0.001 to 1.5 g/m$^2$, more preferably 0.003 to 1.0 g/m$^2$, even more preferably 0.005 to 0.7 g/m$^2$.

<Methods for Forming an Intermediate Layer>

An intermediate layer can be provided by applying a solution of the compound dissolved in water or an organic solvent such as methanol, ethanol, methyl ethyl ketone or the like or a mixed solvent thereof on the substrate and drying it, or immersing the substrate in a solution of the compound dissolved in water or an organic solvent such as methanol, ethanol, methyl ethyl ketone or the like or a mixed solvent thereof to allow the compound to be adsorbed, and then washing it with water or the like and drying it. In the former method, a solution of the compound at a concentration of 0.005 to 10% by mass can be applied by various techniques.

Any technique can be used, such as bar coating, spin coating, spray coating, curtain coating and the like, for example. In the latter method, the concentration of the solution is 0.01 to 20% by mass, preferably 0.05 to 5% by mass, the immersion temperature is 20 to 90° C., preferably 25 to 50° C., and the immersion time is 0.1 second to 20 minutes, preferably 2 seconds to 1 minute.

[Back Coating Layer]

After the support has been subjected to a surface treatment or after a primer layer has been formed, a back coating layer can be provided on the bottom of the support, as appropriate. The back coat layer is preferably exemplified by a cover layer composed of the organic polymer compounds described in Japanese Laid-Open Patent Publication No. H05-45885, or composed of the metal oxides described in Japanese Laid-Open Patent Publication No. H06-35174 which are obtained by allowing organic metal compound or inorganic metal compound to hydrolyze or undergo polycondensation. Among them, alkoxy compounds of silicon, such as $Si(OCH_3)_4$, $Si(OC_2H_5)_4$, $Si(OC_3H_7)_4$, $Si(OC_4H_9)_4$ are preferable in view of inexpensiveness and availability of the source materials.

<Photosensitive Layer>

The photosensitive layer in the present invention comprises (A) a polymerizable compound, (B) a polymerization initiator, (C) a specific polyvinyl acetal binder, and (D) an acrylic resin binder. Further, it may comprise (E) a sensitizer, and (F) a colorant. Besides these components, it may also comprise other photosensitive layer components.

(A) Polymerizable Compound

The polymerizable compound used for the image recording layer in the present invention is an addition polymerizable compound having at least one ethylenic unsaturated double bond, and is selected from compounds having at least one, and preferably two, terminal ethylenic unsaturated bonds. These compounds typically have any of chemical forms including monomer; prepolymer such as dimer, trimer and oligomer; and mixtures of them. Examples of the monomer include unsaturated carboxylic acid (for example, acrylic acid, methacrylic acid, itaconic acid, crotonic acid, isocrotonic acid, maleic acid), esters of them, and amides of them. More preferable examples include esters formed between unsaturated carboxylic acid and polyhydric alcohol compound, and amides formed between unsaturated carboxylic acid and polyvalent amine compound. Still other preferable examples include adducts of unsaturated carboxylate esters or amides having nucleophilic substituent group such as hydroxy group, amino group, mercapto group or the like, formed together with monofunctional or polyfunctional isocyanates or epoxys; and dehydration condensation product formed together with monofunctional or polyfunctional carboxylic acid. Still other preferable examples include adducts of unsaturated carboxylate esters or amides having electrophilic substituent group such as isocyanate group and epoxy group, formed together with monofunctional or polyfunctional alcohols, amines, or thiols; and substitution products of unsaturated carboxylate esters or amides having eliminative substituent group such as halogen group and tosyloxy group, formed together with monofunctional or polyfunctional alcohols, amines, or thiols.

Also compounds obtained by replacing the above-described unsaturated carboxylic acid with unsaturated phosphonic acid, styrene, vinyl ether or the like are also adoptable.

Specific examples of the monomer in the form of acrylate ester formed between polyhydric alcohol compound and unsaturated carboxylic acid include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanurate ethylene oxide (EO)-modified triacrylate, and polyester acrylate oligomer. Examples of methacrylate ester include tetramethylene glycol dimethacrylate, neopentyl glycol dimethacrylate, trimethylolpropane trimethacrylate, ethylene glycol dimethacrylate, pentaerythritol trimethacrylate, bis[p-

(3-methacryl oxy-2-hydroxypropoxy)phenyl]dimethylmethane, and bis-[p-(methacryloxyethoxy)phenyl]dimethylmethane. Specific examples of the monomer in the form of amide formed between polyvalent amine compound and unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Also urethane-based addition polymerizable compound, obtainable by addition polymerization between the isocyanate and hydroxy group, is preferable. Preferable examples of this sort of compound include vinyl urethane compound having two or more polymerizable vinyl groups per one molecule, which is obtainable by addition reaction between a vinyl monomer having a hydroxy group represented by the formula (A) below, and a polyisocyanate compound having two or more isocyanate groups per one molecule, as described in Examined Japanese Patent Publication No. S48-41708.

$$CH_2=C(R^4)COOCH_2CH(R^5)OH \quad (A)$$

(where, each of $R^4$ and $R^5$ represents H or $CH_3$.)

Also preferred are the urethane acrylates described in JP-A-S51-37193, JP-B-H2-32293, and JP-B-H2-16765, as well as the urethane compounds having an ethylene oxide skeleton described in JP-B-S58-49860, JP-B-S56-17654, JP-B-S62-39417, and JP-B-S62-39418.

Further, the photooxidizable polymerizable compounds described in JP-A2007-506125 are also preferred, among which the polymerizable compounds containing at least one urea group and/or tertiary amino group are especially preferred.

In the present invention, compounds containing a urethane bond and/or urea bond are especially preferred, and more preferred are (meth)acrylates containing a urethane bond and/or urea bond. In the present invention, multifunctional polymerizable compounds are also preferred, and more preferred are bi- or trifunctional polymerizable compounds. The advantages of the present invention tend to be provided more effectively by employing such compounds. Specifically, the compound shown below is included.

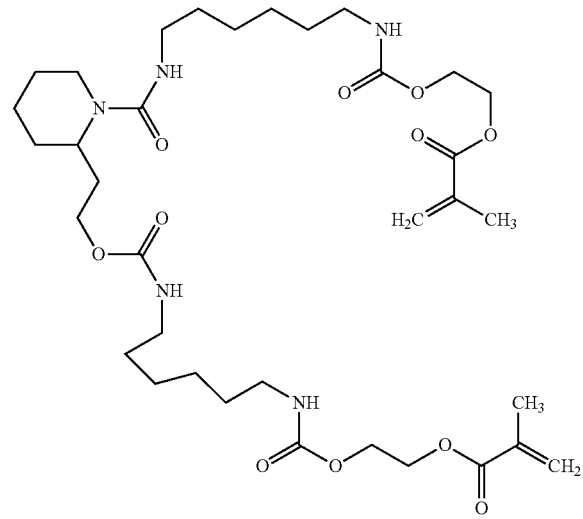 [SMILES: C=C(C)C(=O)OCCOC(=O)NCCCCCCNC(=O)OCCC1CCCCN1C(=O)NCCCCCCNC(=O)OCCOC(=O)C(=C)C]

Details of methods for using these polymerizable compounds such as their structures, whether they should be used alone or in combination, the amount to be added and the like can be appropriately determined depending on the performance design of the final lithographic printing plate precursor, and one embodiment uses a compound containing a urethane bond and a compound containing a urea bond in combination, as an example. The polymerizable compounds described above are preferably used in the range of 5 to 75% by weight, more preferably 25 to 70% by weight, even more preferably 30 to 60% by weight based on the total solids of the photosensitive layer.

(B) Polymerization Initiator

The photosensitive layer of the present invention preferably contains a polymerization initiator (hereinafter also referred to as an "initiator compound"). In the present invention, a radical polymerization initiator is preferably used.

The initiator compound may be arbitrarily selected from compounds known among those skilled in the art without limitation. Specific examples include trihalomethyl compound, carbonyl compound, organic peroxide, azo compound, azide compound, metallocene compound, hexaarylbiimidazole compound, organic boron compound, disulfone compound, oxim ester compound, onium salt compound, and iron arene complex. In particular, the initiator compound is preferably at least one species selected from the group consisting of hexaarylbiimidazole compound, onium salt, trihalomethyl compound and metallocene compound, and is particularly hexaarylbiimidazole compound, or onium salt. Two or more species of them may be used in combination as the polymerization initiator.

The hexaarylbiimidazole compound is exemplified by lophine dimers described in European Patent Nos. 24,629 and No. 107,792, and U.S. Pat. No. 4,410,621, which are exemplified by 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole. It is particularly preferable that the hexaarylbiimidazole compound is used in combination with a sensitizing dye which shows maximum absorption in the wavelength range from 300 to 450 nm.

Onium salts that are preferably used in the present invention include sulfonium salts, iodonium salts, and diazonium salts. Especially, diaryl iodonium salts, and triaryl sulfonium salts are preferably used. The onium salts are especially preferably used in combination with an infrared absorber having a maximum absorption between 750 and 1400 nm.

Details about the onium salts can be found in the description at paragraph 0049 of JP-A2012-031400. More preferred are iodonium salts, sulfonium salts and azinium salts. Specific examples of these compounds are shown below, but it should be understood that the present invention is not limited to these examples.

The iodonium salt is preferably diphenyliodonium salt, more preferably diphenyliodonium salt substituted by an electron donor group such as alkyl group or alkoxyl group, and still more preferably asymmetric diphenyliodonium salts. Specific examples include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6- trimethoxyphenyliodonium hexafluorophosphate, and bis(4-t-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate, tris(4-chlorophenyl)sulfonium 3,5-bis(methoxycarbonyl)benzenesulfonate, and tris(4-chlorophenyl)sulfonium hexafluorophosphate.

Examples of the azinium salt include 1-cyclohexylmethyloxypyrydinium hexafluorophosphate, 1-cyclohexyloxy-4-phenylpyrydinium hexafluorophosphate, 1-ethoxy-4-phenylpyrydinium hexafluorophosphate, 1-(2-ethylhexyloxy)-4-phenylpyrydinium hexafluorophosphate, 4-chloro-1-cyclohexylmethyloxypyrydinium hexafluorophosphate, 1-ethoxy-4-cyanopyrydinium hexafluorophosphate, 3,4-dichloro-1-(2-ethylhexyloxy)pyrydinium hexafluorophosphate, 1-benzyloxy-4-phenylpyrydinium hexafluorophosphate, 1-phenetyloxy-4-phenylpyrydinium hexafluorophosphate, 1-(2-ethylhexyloxy)-4-phenylpyrydinium p-toluenesulfonate, 1-(2-ethylhexyloxy)-4-phenylpyrydinium perfluorobutanesulfonate, 1-(2-ethylhexyloxy)-4-phenylpyrydinium bromide, and 1-(2-ethylhexyloxy)-4-phenylpyrydinium tetrafluoroborate.

It is particularly preferable that the onium salt is used in combination with an infrared absorber which shows maximum absorption in the wavelength range from 750 to 1400 nm.

Besides them, also polymerization initiators described in paragraphs [0071] to [0129] of Japanese Laid-Open Patent Publication No. 2007-206217 are preferably used.

In the present invention, the polymerization initiators can be conveniently used alone or as a combination of two or more of them.

The amount of the polymerization initiators used in the photosensitive layer in the present invention is preferably 0.01 to 20% by weight, more preferably 0.1 to 15% by weight based on the weight of the total solids of the photosensitive layer. Even more preferably, it is 1.0% by weight to 10% by weight.

<(C) Binder Comprising a Polyvinyl Acetal Containing at Least One Kind of Repeat Units Represented by General Formula (I-c), General Formula (I-b) and General Formula (I-a)>

In the present invention, the specific polyvinyl acetal binder is characterized in that it comprises at least a vinyl acetal repeat unit and at least one kind of repeat units represented by general formula (I-c), general formula (I-b) and general formula (I-a). Preferably, the polyvinyl acetal used in the present invention is polyvinyl butyral. Such specific polyvinyl acetal binders are e.g., polymers containing at least one kind of repeat units represented by general formula (I-c), general formula (I-b) and general formula (I-a) introduced by modifying a polyvinyl acetal synthesized by reacting polyvinyl alcohol obtained by partial or total saponification of polyvinyl acetate with an aldehyde under acidic conditions (acetalization reaction). Most preferably, the aldehyde used for acetalization is butyl aldehyde.

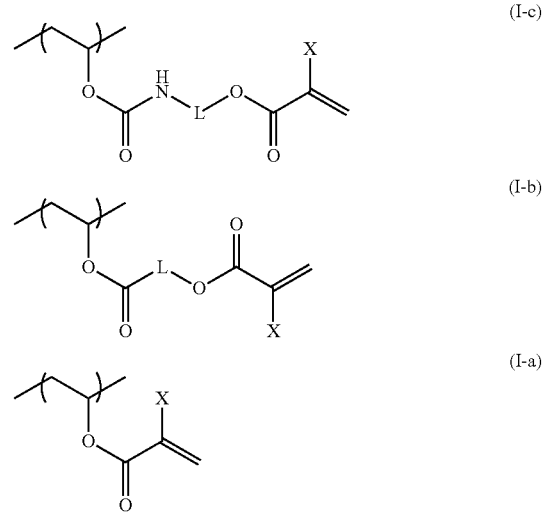

In the formulae above, X each represents a hydrogen atom or a methyl group, and L each represents a divalent linking group.

Preferably, the repeat units represented by general formula (I-c), general formula (I-b) and general formula (I-a) are the repeat unit represented by general formula (I-b) or (I-c), even more preferably the repeat unit represented by general formula (I-c).

Preferably, the repeat units represented by general formula (I-c), general formula (I-b) and general formula (I-a) are represented by any one of general formulae (II) to (V) shown below, more preferably represented by any one of general formulae (III) to (V), even more preferably represented by any one of general formulae (III) to (V).

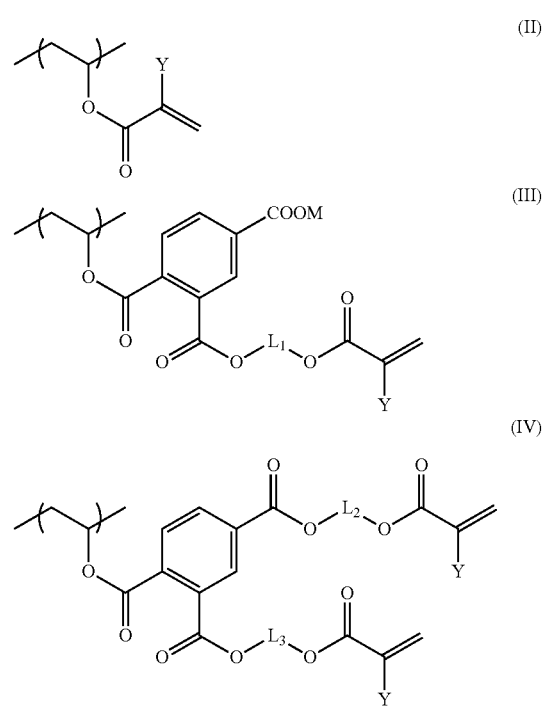

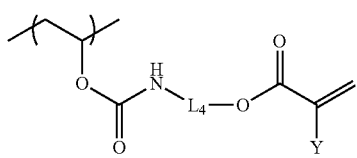
(V)

In the formulae above, Y each represents a hydrogen atom or a methyl group, M represents a hydrogen atom, a lithium atom, a sodium atom or a potassium atom, and $L^1$ to $L^4$ each represent an optionally substituted alkyl group, an optionally substituted alkylene group, or an optionally substituted aryl group.

Preferably, Y represents a hydrogen atom.

Preferably, $L^1$ to $L^4$ each represent an alkyl group, more preferably an alkyl group containing 1 to 6 carbon atoms, even more preferably an alkyl group containing 1 to 4 carbon atoms, especially preferably an alkyl group containing 2 carbon atoms. Substituents optionally present on $L^1$ to $L^4$ include a hydroxyl group.

In the present invention, preferred examples of the repeat units represented by general formula (I-c), general formula (I-b) and general formula (I-a) include copolymers having any one of the specific units shown below. However, the present invention is not limited to these examples.

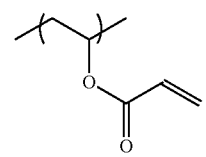
a-1

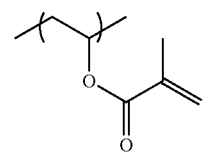
a-2

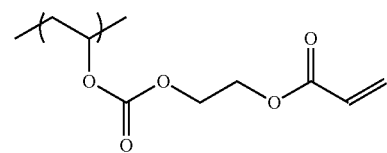
b-1

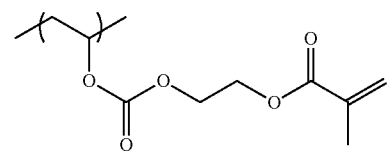
b-2

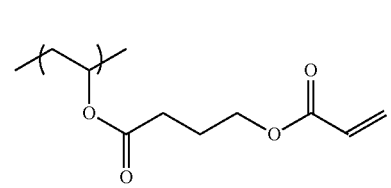
b-3

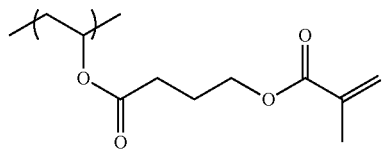
b-4

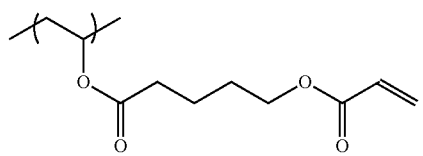
b-5

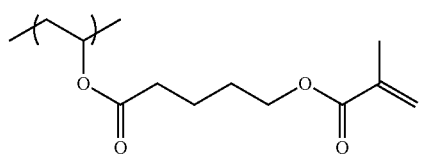
b-6

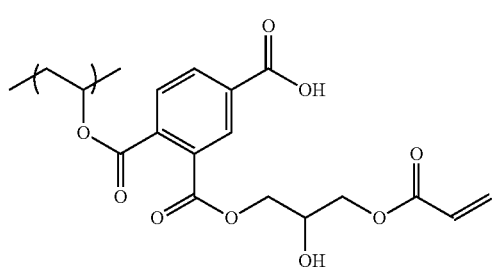
c-1 c-2 c-3 c-4 c-5
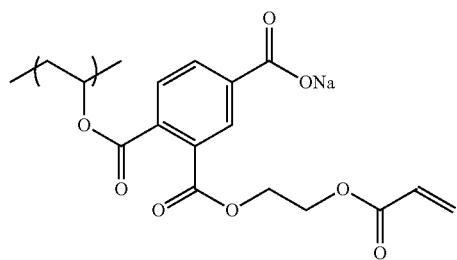
c-6
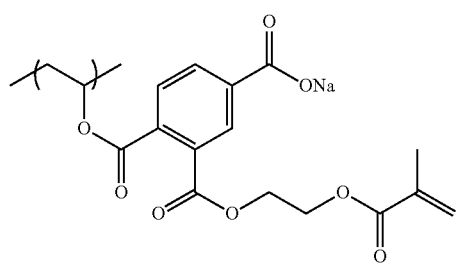
c-7
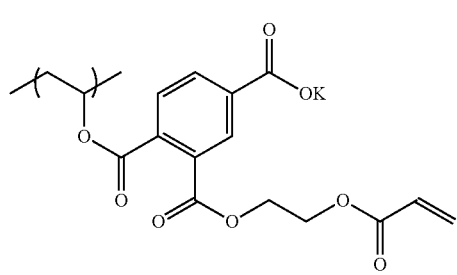
c-8
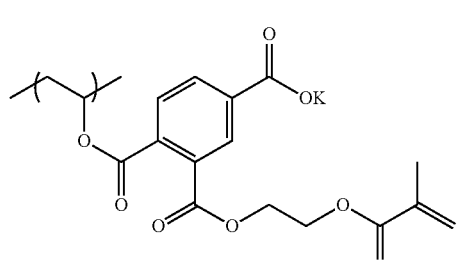
c-9
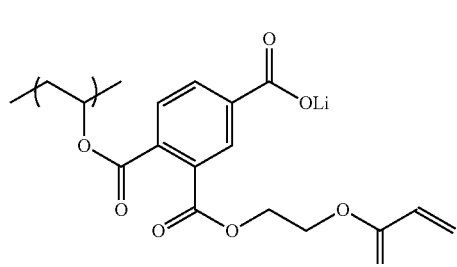
c-10
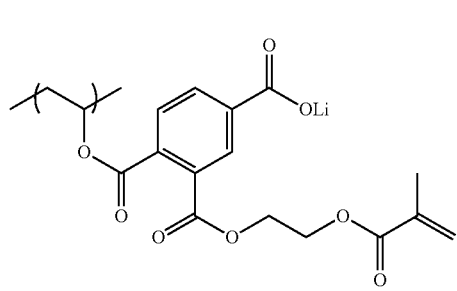
c-11
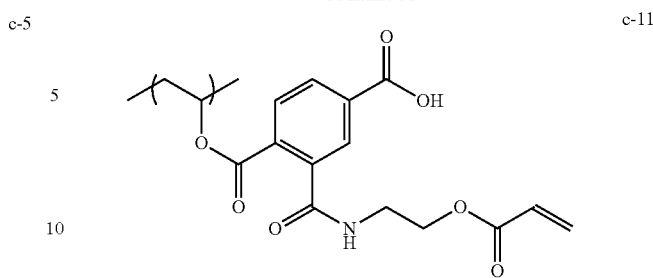
c-12
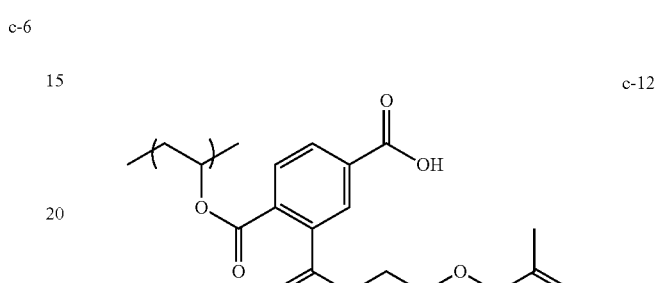
d-1
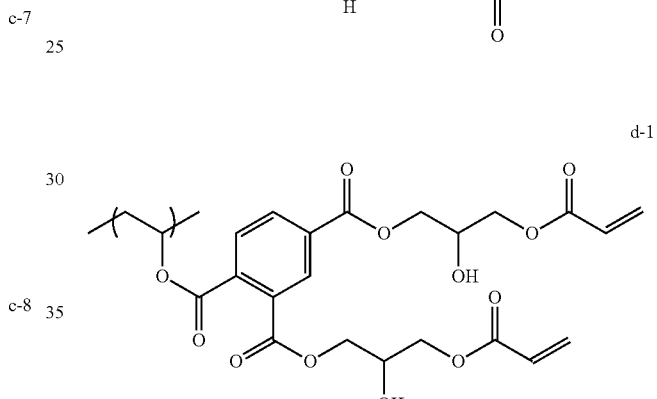
d-2
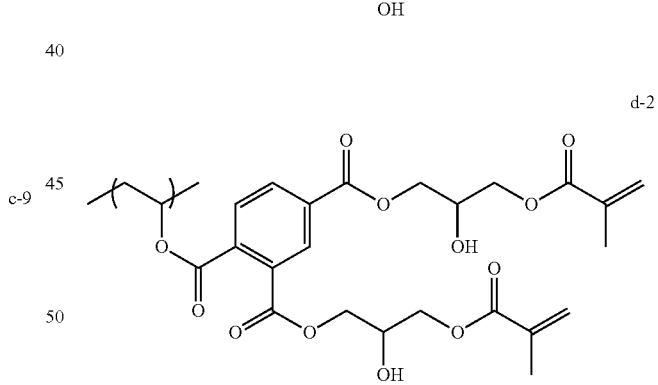
d-3
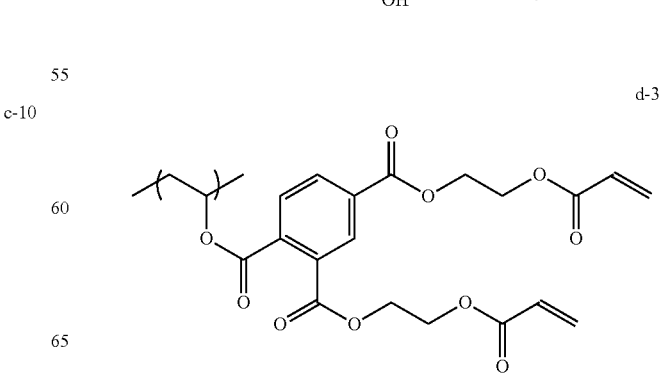

d-4
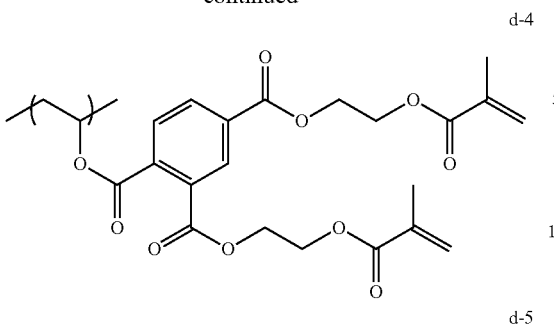

d-5
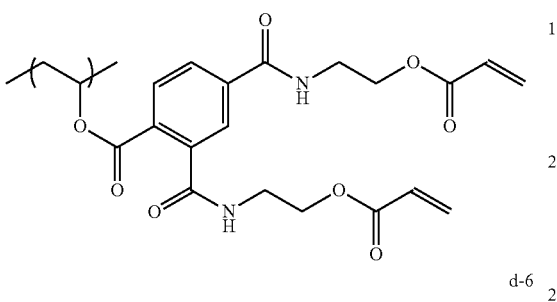

d-6
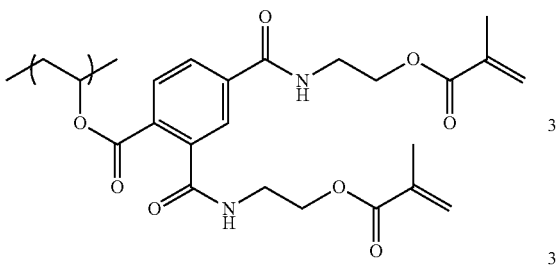

e-1
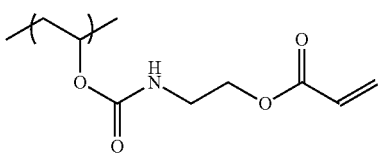

e-2
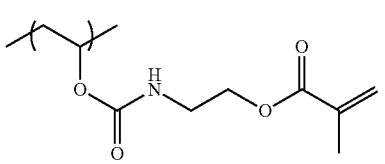

e-3
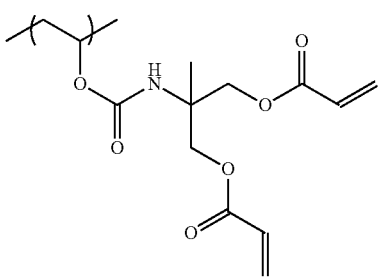

e-4
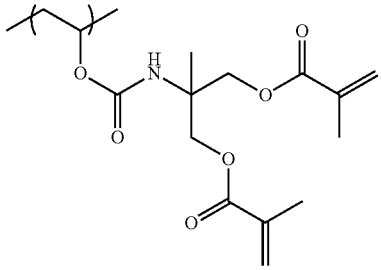

Among them, specific units that are preferably used are a-1, a-2, c-1, c-2, d-1, d-2, and e-1 to e-4, more preferably c-1, c-2, d-1, d-2, and e-1 to 4, especially preferably e-1 to 4.

Preferably, the specific polyvinyl acetal binder used in the present invention contains the repeat units represented by general formula (I-c), general formula (I-b) and general formula (I-a) at a proportion of 5 to 35 mol %, more preferably 10 to 25 mol % in total.

Preferably, the specific polyvinyl acetal binder used in the present invention contains the repeat unit (1) shown above at a proportion of 40 to 90 mol %, more preferably 55 to 85 mol %.

Preferably, the specific polyvinyl acetal binder used in the present invention contains the repeat unit (2) shown above at a proportion of 0 to 25 mol %, more preferably 0 to 10 mol %.

Preferably, the specific polyvinyl acetal binder used in the present invention contains the repeat unit (3) shown above at a proportion of 1 to 40 mol %, more preferably 1 to 35 mol %.

Preferably, the specific polyvinyl acetal binder used in the present invention contains an acid group at a proportion of 0 to 35 mol %, more preferably 0 to 25 mol %.

Further, the specific polyvinyl acetal binder of the present invention preferably contains repeat units other than the repeat units represented by general formula (I-c), general formula (I-b) and general formula (I-a), the repeat units (1) to (3) shown above and the acid group at a proportion of 20 mol % or less, more preferably 10 mol % or less. The advantages of the present invention tend to be provided more effectively by selecting such ranges.

Acid groups contained in the specific polyvinyl acetal binder used in the present invention include carboxylic acid group, sulfonic acid group, phosphonic acid group, phosphoric acid group, sulfonamide group and the like, among which especially preferred are carboxylic acid groups such as repeat units derived from (meth)acrylic acid, the repeat unit represented by general formula (II) shown below, and the repeat unit represented by formula (4).

(II)

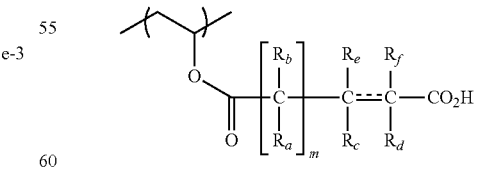

In general formula (II), Ra, Rb, Rc, Rd, Re, and Rf each represent a single bond, a hydrogen atom or an optionally substituted monovalent substituent, and m represents 0 or 1.

Preferred substituents for Ra, Rb, Rc, Rd, Re, and Rf include optionally substituted alkyl groups, halogen atoms, and optionally substituted aryl groups, preferably straight-chain alkyl groups such as methyl, ethyl and propyl, carboxyl-substituted alkyl groups, halogen atoms, phenyl groups, and carboxyl-substituted phenyl groups.

Rc and Rd as well as Re and Rf can form a bond. The bond between the carbon atom to which Rc and Re are attached and the carbon atom to which Rd and Rf are attached is a single bond or a double bond or an aromatic double bond, and in cases of a double bond or an aromatic double bond, Rc and Rd or Re and Rf or Rc and Rf or Re and Rd combine to form a single bond.

Specific preferred examples of the units containing a carboxylic acid group described above are shown below.

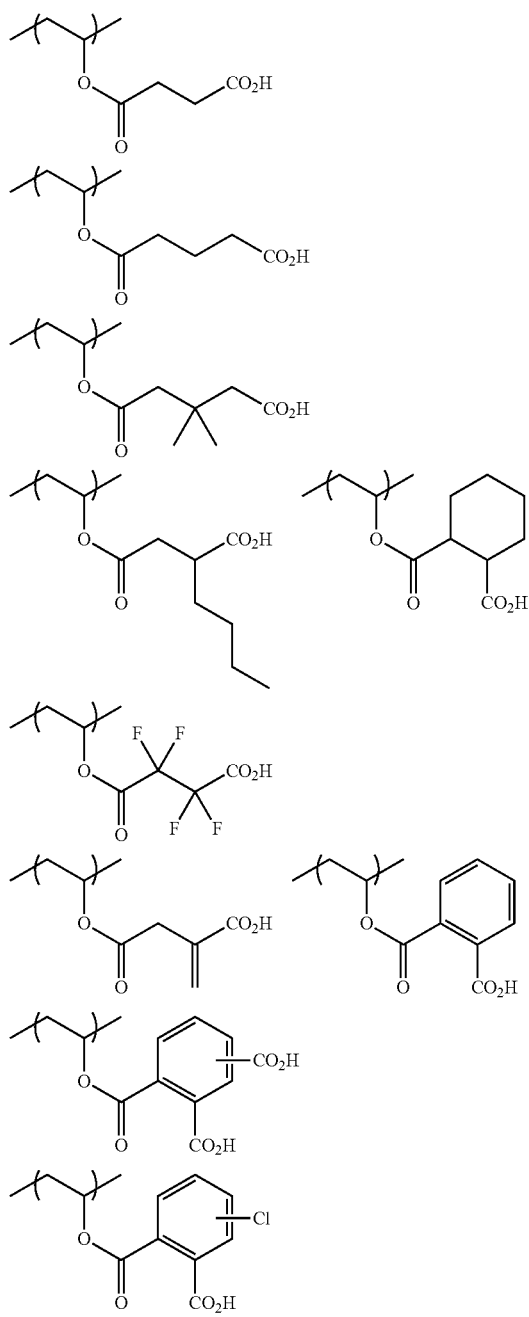

Next, the repeat unit represented by formula (4) is explained.

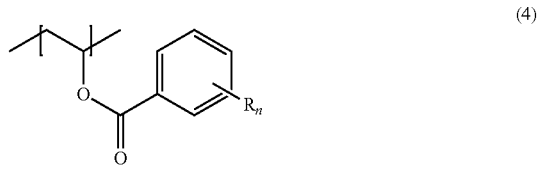

In the formula above, R represents $COOR^1$ wherein $R^1$ represents Li, Na or K. n is an integer of 1 to 5, preferably 2. Preferably, $R^1$ represents Na or K, more preferably Na.

Further, the acid group of acid group-containing polymers included as preferred examples of the specific polyvinyl acetal binder may be neutralized by a basic compound, especially preferably by a basic nitrogen-containing compound such as amino, amidine, guanidine or the like group. Further, the basic nitrogen-containing compound preferably has an ethylenically unsaturated group. Specific compounds include the compounds described in WO 2007/057442.

Preferably, the specific polyvinyl acetal binder has a weight average molecular weight of 5000 or more, more preferably 10,000 to 300,000, even more preferably 10,000 to 100,000. Further, the binder polymer in the present invention preferably has a number average molecular weight of 1000 or more, more preferably 2000 to 250,000. Preferably, its polydispersity (weight average molecular weight/number average molecular weight) is 1.1 to 10.

The specific polyvinyl acetal binders may be used alone or as a mixture of two or more of them. Preferably, the content of the specific polyvinyl acetal binders is 5 to 80% by weight, more preferably 10 to 75% by weight, even more preferably 10 to 65% by weight based on the total solids of the photosensitive layer to achieve good strength and image-forming property in image areas.

<(D) Acrylic Resin>

In addition to the specific polyvinyl acetal binder, the photosensitive layer in the present invention comprises (D) an acrylic resin binder. Preferably, the acrylic resin binder contains an acid group to improve developability.

Preferred examples of acid groups in the acrylic resin in the present invention include carboxylic acid group, sulfonic acid group, phosphoric acid group, phosphoric acid group, sulfonamide group and the like, among which carboxylic acid groups such as repeat units derived from (meth)acrylic acid and the repeat unit represented by general formula (I) shown below are preferably used.

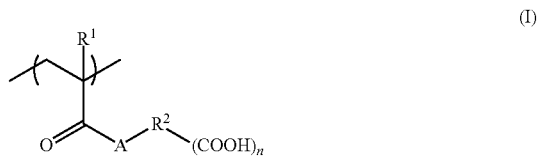

In the formula (I), $R^1$ represents a hydrogen atom or methyl group, $R^2$ represents a single bond or n+1 monovalent linking groups. $A^1$ represents an oxygen atom or $-NR^3-$, and $R^3$ represents a hydrogen atom or $C_{1-10}$ monovalent hydrocarbon group. $n_1$ represents an integer from 1 to 5.

The linking group represented by $R^2$ in the formula (I) is composed of hydrogen atom, carbon atom, oxygen atom, nitrogen atom, sulfur atom and halogen atom, with a total number of atoms of preferably 1 to 80. More specifically, the alkylene group, substituted alkylene group, arylene group, and substituted arylene group are exemplified. A plurality of these divalent groups may be linked with any of amide bond and ester bond. $R^2$ preferably has a structure in which a plurality of single bonds, alkylene groups and substituted alkylene groups; more preferably has a structure in which a plurality of single bonds, $C_{1-5}$ alkylene groups and $C_{1-5}$ substituted alkylene groups; and particularly has a structure in which a plurality of single bonds, $C_{1-3}$ alkylene group and $C_{1-3}$ substituted alkylene group.

The substituent group includes group of monovalent non-metallic atoms excluding hydrogen atom, wherein examples of which include halogen atom (—F, —Br, —Cl, —I), hydroxy group, alkoxy group, aryloxy group, mercapto group, alkylthio group, arylthio group, alkylcarbonyl group, arylcarbonyl group, carboxyl group and its conjugate base group, alkoxy carbonyl group, aryloxy carbonyl group, carbamoyl group, aryl group, alkenyl group, and alkynyl group.

$R^3$ is preferably a hydrogen atom or $C_{1-5}$ hydrocarbon group, more preferably a hydrogen atom or $C_{1-3}$ hydrocarbon group, and particularly a hydrogen atom or methyl group.

n is preferably 1 to 3, more preferably 1 or 2, and particularly 1.

Preferably, the proportion (mol %) of copolymer components containing a carboxylic acid group in all of the repeat units in the acrylic resin is 1 to 70% to improve developability. More preferably, it is 1 to 50%, especially preferably 1 to 30% to improve developability and printing durability simultaneously.

It is preferable for the acrylic resin used in the present invention to additionally have a crosslinkable group. The crosslinkable group herein means a group capable of crosslinking the binder polymer, in the process of radical polymerization reaction which proceeds in the photosensitive layer, when the lithographic printing plate precursor is exposed to light. While the functional group is not specifically limited so long as it can exhibit the above-described function, examples of the functional group capable of proceeding addition polymerization reaction include ethylenic unsaturated binding group, amino group, and epoxy group. The functional group may also be a functional group capable of producing a radical upon being exposed to light, and this sort of crosslinkable group is exemplified by thiol group and halogen group. Among them, ethylenic unsaturated binding group is preferable. The ethylenic unsaturated binding group is preferably styryl group, (meth)acryloyl group, or allyl group.

The acrylic resin cures in such a way that a free radical (polymerization initiating radical, or propagating radical in the process of polymerization of radical or polymerizable compound) attaches to the crosslinkable functional group, and crosslinkage is formed among the polymer molecules thereof, by addition polymerization which proceeds directly among the polymer molecules or by sequential polymerization of the polymerizable compounds. Alternatively, the binder cures in such a way that atoms (for example, hydrogen atoms on carbon atoms adjacent to the functional crosslinking groups) in the polymer are abstracted by free radicals to produce polymer radicals, and the resultant polymer radicals then combine with each other to produce the crosslinkages among the polymer molecules.

The content of the crosslinkable group in the acrylic resin (content of radical polymerizable unsaturated double bond determined by iodometry) is preferably 0.01 to 10.0 mmol per one gram of the binder polymer, more preferably 0.05 to 5.0 mmol, and particularly 0.1 to 2.0 mmol.

Besides the above-described repeating unit having an acid group, and the polymerization unit having a crosslinkable group, the acrylic resin used in the present invention may have a polymerization unit of alkyl(meth)acrylate or aralkyl(meth)acrylate. The alkyl group of alkyl(meth)acrylate is preferably a $C_{1-5}$ alkyl group, and more preferably methyl group. The aralkyl(meth)acrylate is exemplified by benzyl(meth)acrylate.

Preferably, the acrylic resin has a weight average molecular weight of 5000 or more, more preferably 10,000 to 300,000, and a number average molecular weight of 1000 or more, more preferably 2000 to 250,000. Preferably, its polydispersity (weight average molecular weight/number average molecular weight) is 1.1 to 10.

The acrylic resins may be used alone or as a mixture of two or more of them. Preferably, the content of the binder polymers is 5 to 75% by mass, more preferably 10 to 70% by mass, even more preferably 10 to 60% by mass based on the total solids of the photosensitive layer to achieve good strength and image-forming property in image areas.

Further, the weight ratio between the specific polyacetal binder and the acrylic resin is preferably 1:1 to 6:1, more preferably 2:1 to 4:1. The advantages of the present invention tend to be provided more effectively by selecting such ranges.

Furthermore, the total content of all of the binder components and the polymerizable compound in the present invention is preferably 80% by mass or less based on the total solids of the photosensitive layer. If it exceeds 80% by mass, sensitivity may decrease or developability may decrease. More preferably, it is 35 to 75% by mass.

In the present invention, the penetration of the developer into the photosensitive layer is further improved and therefore developability is further improved by controlling the proportion of the polymerizable compound and all of the binder polymers (e.g., the total of the specific polyacetal binder and the acrylic resin) in the photosensitive layer of the lithographic printing plate precursors. Thus, the weight ratio between the radical polymerizable compound and binder polymers in the photosensitive layer is preferably 1.2 or more, more preferably 1.25 to 4.5, most preferably 2 to 4.

<Sensitizing Dye>

Preferably, the photosensitive layer in the present invention comprises a sensitizing dye. Any sensitizing dye can be used without specific limitation so far as it is excited upon light absorption during imagewise exposure to impart energy to the polymerization initiator described later herein via electron transfer, energy transfer or heat generation or the like, thereby improving the polymerization-initiating function. Especially, sensitizing dyes having a maximum absorption between 300 and 450 nm or between 750 and 1400 nm are preferably used.

The sensitizing dyes showing maximum absorption in the wavelength range from 350 to 450 nm include merocyanines, benzopyranes, coumarines, aromatic ketones, anthracenes.

Among the sensitizing dyes showing maximum absorption in the wavelength range from 350 to 450 nm, preferable dyes are those represented by the formula (IX), from the viewpoint of large sensitivity.

Formula (IX)

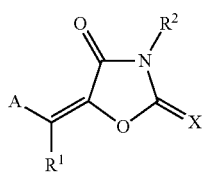

In the formula (IX), A represents an aryl group or heteroaryl group which may have a substituent group, and X represents an oxygen atom, sulfur atom or =N(R$^3$). Each of R$^1$, R$^2$ and R$^3$ independently represents a monovalent group of non-metallic atom, wherein A and R$^1$, or R$^2$ and R$^3$, may combine respectively to form an aliphatic or aromatic ring.

The formula (IX) will now be further detailed. The monovalent group of non-metallic atom represented by R$^1$, R$^2$ or R$^3$ is preferably substituted or unsubstituted alkyl group, substituted or unsubstituted alkenyl group, substituted or unsubstituted aryl group, substituted or unsubstituted heteroaryl group, substituted or unsubstituted alkoxy group, substituted or unsubstituted alkylthio group, hydroxy group, and halogen atom.

Next, A in general formula (IX) is explained. A represents an optionally substituted aromatic cyclic group or heterocyclic group, and specific examples of optionally substituted aromatic rings or heterocycles include those similar to the examples mentioned for R$^1$, R$^2$ and R$^3$ in general formula (IX).

Specific examples of such sensitizing dyes that are preferably used include the compounds described in paragraphs [0047] to [0053] of JP-A2007-58170.

Further, sensitizing dyes represented by general formula (V) to (VI) shown below can also be used.

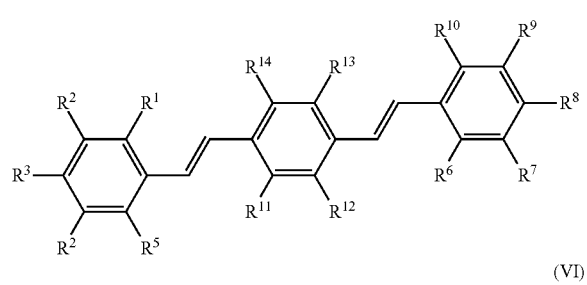

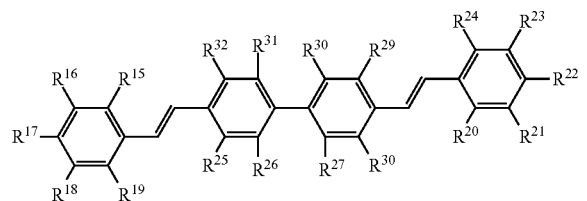

In formula (V), R$^1$ to R$^{14}$ each independently represent a hydrogen atom, an alkyl group, an alkoxy group, a cyano group or a halogen atom, provided that at least one of R$^1$ to R$^{10}$ represents an alkoxy group containing two or more carbon atoms.

In formula (VI), R$^{15}$ to R$^{32}$ each independently represent a hydrogen atom, an alkyl group, an alkoxy group, a cyano group or a halogen atom, provided that at least one of R$^{15}$ to R$^{24}$ represents an alkoxy group containing two or more carbon atoms.

Specific examples of such sensitizing dyes that are preferably used include the compounds described in EP-A-1 349 006 and WO 2005/029187.

Further, the sensitizing dyes described in JP-A2007-171406, JP-A2007-206216, JP-A2007-206217, JP-A2007-225701, JP-A2007-225702, JP-A2007-316582, and JP-A2007-328243 can also be preferably used.

Next, sensitizing dyes having a maximum absorption between 750 and 1400 nm (hereinafter sometimes referred to as "infrared absorbers") that are preferably used in the present invention are explained in detail. Infrared absorbers that are preferably used include dyes or pigments.

The dye adoptable herein may be arbitrarily selected from commercially available dyes and those described in literatures such as "Senryo Binran (Dye Handbook)" (edited by The Society of Synthetic Organic Chemistry, Japan, 1970). The specific examples include azo dye, metal complex azo dye, pyrazolone azo dye, naphthoquinone dye, anthraquinone dye, phthalocyanine dye, carbonium dye, quinone imine dye, methine dye, cyanine dye, squarylium colorant, pyrylium salt dye, and metal thiolate complex dye.

Among them, particularly preferable examples include cyanine colorant, squarylium colorant, pyrylium salt, nickel thiolate complex, and indolenine cyanine colorant. More preferable examples include cyanine colorant and indolenine cyanine colorant, and particularly preferable example include a cyanine colorant represented by the formula (a) below:

Formula (a)

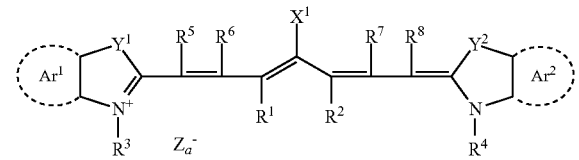

In the formula (a), X$^1$ represents a hydrogen atom, halogen atom, —NPh$_2$, —X$^2$-L$^1$ or the group shown below. In the formula, X$^2$ represents an oxygen atom, nitrogen atom or sulfur atom, and L$^1$ represents a C$_{1-12}$ hydrocarbon group, aryl group having a hetero atom (N, S, O, halogen, Se), and C$_{1-12}$ hydrocarbon group having a hetero atom. X$_a^-$ is synonymous with Z$_a^-$ described later. R$^a$ represents a substituent group selected from hydrogen atom or alkyl group, aryl group, substituted or unsubstituted amino group, and halogen atom.

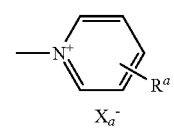

Each of R$^1$ and R$^2$ independently represents C$_{1-12}$ hydrocarbon group. From the viewpoint of stability of coating liquid for forming the photo sensitive layer, each of R$^1$ and R$^2$ is preferably a C$_2$ or longer hydrocarbon group. R$^1$ and R$^2$ may combine with each other to form a ring which is preferably a five-membered ring or six-membered ring.

Ar$^1$ and Ar$^2$ may be same or different, and each represents an aryl group which may have a substituent group. Preferable examples of the aryl group include benzene ring group and naphthalene ring group. Preferable examples of the substituent group include $C_{12}$ or shorter hydrocarbon group, halogen atom, and $C_{12}$ or shorter alkoxy group. $Y^1$ and $Y^2$ may be same or different, and each represents a sulfur atom or $C_{12}$ or shorter dialkylmethylene group. $R^3$ and $R^4$ may be same or different, and each represents a $C_{20}$ or shorter hydrocarbon group which may have a substituent group. Preferable examples of the substituent group include a $C_{12}$ or shorter alkoxy group, carboxyl group, and sulfo group. $R^5$, $R^6$, $R^7$ and $R^8$ may be same or different, and each represents a hydrogen atom or $C_{12}$ or shorter hydrocarbon group. From the viewpoint of availability of the source materials, hydrogen atom is preferable. $Z_a^-$ represents a counter anion. Note that $Z_a^-$ is not necessary if the cyanine colorant represented by the formula (a) has an anionic substituent group in the structure thereof, and is omissible if there is no need of neutralization of electric charge. Preferable examples of $Z_a^-$ include halide ion, perchlorate ion, tetrafluoroborate ion, hexafluorophosphate ion and sulfonate ion from the viewpoint of storage stability of coating liquid for forming the photo sensitive layer. Particularly preferable examples include perchlorate ion, hexafluorophosphate ion and aryl sulfonate ion. Especially preferred are those not containing a halogen ion as a counter ion.

Specific examples of cyanine dyes represented by general formula (a) that can be preferably used include those described in paragraphs [0017] to [0019] of JP-A2001-133969.

Further, other especially preferred examples include the specific indolenine cyanine dyes described in JP-A2002-278057, supra.

Pigments that can be used include commercially available pigments and the pigments described in Colour Index International (C.I.) database, "Latest Pigment Handbook" (edited by Japan Association of Pigment Technology, published in 1977), "Latest Pigment Applied Technology" (CMC Publishing Co., Ltd., published in 1986), and "Printing Ink Technology" (CMC Publishing Co., Ltd., published in 1984).

The preferred amount of these sensitizing dyes to be added is preferably in the range of 0.05 to 30 parts by weight, more preferably 0.1 to 20 parts by weight, most preferably 0.2 to 10 parts by weight per 100 parts by weight of the total solids in the photosensitive layer.

<Colorant>

The photosensitive layer in the present invention may also comprise a colorant. The colorant can be a dye or a pigment. Colorants that can be used include, but not limited to, the colorants described in JP-A2009-516222 and WO 2007/057348.

Pigments used as colorants include, for example, organic pigments, inorganic pigments, carbon black, metallic powder pigments, fluorescent pigments and the like, preferably organic pigments.

Specific examples of organic pigments include quinacridone pigments, quinacridone quinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments, etc.

Specific examples of pigments usable as colorants include those described in JP-A2009-516222 and JP-A2010-139551.

In the present invention, blue colored pigments including cyan pigments are preferably used.

The pigments may be subjected to surface treatment of the pigment particles. Methods for surface treatment include methods of applying a surface coat of resin, methods of applying surfactant, and methods of bonding a reactive material (for example, a silane coupling agent, an epoxy compound, polyisocyanate, or the like) to the surface of the pigment and the like. Specific examples of surface-treated pigments are the modified pigments described in WO 02/04210, and specifically the blue colored modified pigments described in WO 02/04210 are preferably used.

The pigments have a particle size which is preferably less than 10 μm, more preferably less than 5 μm, and especially preferably less than 3 μm. The method for dispersing the pigments may be any known dispersion method which is used for the production of ink or toner or the like. Dispersing machines include an ultrasonic disperser, a sand mill, an attritor, a pearl mill, a super mill, a ball mill, an impeller, a dispenser, a KD mill, a colloid mill, a dynatron, a three-roll mill and a press kneader and the like. Details are described in "Latest Pigment Applied Technology" (CMC Publications, published in 1986).

So-called self-dispersing pigments can also be used as pigments, and a dispersing agent may be omitted in the preparation of self-dispersing pigments, as appropriate. Specific examples of self-dispersing pigments include pigments subjected to a surface treatment in such a way the pigment surface is compatible with the dispersing liquid, and the like. Self-dispersing pigments in an aqueous medium include, for example, pigments having ionic or ionizable groups or polyethylene oxide chains coupled to the particle surface and the like. Specific examples of ionic or ionizable groups include acid groups or salts thereof such as carboxylic acid group, sulfonic acid, phosphoric acid or phosphonic acid and alkali metal salts of these acids and the like. Specific examples of self-dispersing pigments are described in WO 02/04210, and the blue colored self-dispersing pigments described in WO 02/04210 are preferably used.

The amount of the pigments to be used is preferably in the range of 0.005 $g/m^2$ to 2 $g/m^2$, more preferably 0.007 $g/m^2$ to 0.5 $g/m^2$, even more preferably 0.01 $g/m^2$ to 0.2 $g/m^2$, especially preferably 0.01 $g/m^2$ to 0.1 $g/m^2$.

The colorant can also be a dye. Dyes include known dyes such as commercially available dyes or the dyes described in "Dye Handbook" (edited by the Organic Synthetic Chemistry Association, published in 1970). Specific examples of dyes include, for example, azo dyes, metal complex salt azo dyes, pyrazolone azo dyes, anthraquinone dyes, phthalocyanine dyes, carbionium dyes, quinonimine dyes, methine dyes, and the like. Phthalocyanine dyes are preferred. These dyes are salt-forming organic dyes, and may be oil-soluble dyes and basic dyes.

Specific examples of dyes include those described in JP-A2009-516602 and GB 2 192 792.

The amount of the dyes to be used is preferably in the range of 0.005 $g/m^2$ to 2 $g/m^2$, more preferably 0.007 $g/m^2$ to 0.5 $g/m^2$, even more preferably 0.01 $g/m^2$ to 0.2 $g/m^2$, especially preferably 0.01 $g/m^2$ to 0.1 $g/m^2$.

<Printing-Out Agent>

In the present invention, the photosensitive layer may comprise a printing-out agent. The printing-out agent may be, but not limited to, a compound as described in EP-A-1 491 356, paragraphs [0116] to [0119] on pages 19 and 20, US 2005/8971, paragraphs [0168] to [0172] on page 17, JP-A2009-516222 and WO 2007/057348. Preferred printing-out agents are the compounds described in the unpublished PCT application PCT/EP 2005/053141 filed Jul. 1, 2005, from line 1, page 9 to line 27, page 20. More preferred are the IR-dyes as described in the unpublished Patent Application EP 05 105 440.1 filed Jun. 21, 2005, from line 32, page 5 to line 9, page 32.

<Contrast>

The contrast of an image is defined as the difference between optical densities at exposed areas and non-exposed areas, and the contrast is preferably higher.

The contrast increases with increasing optical density in the exposed areas and/or decreasing optical density in the non-exposed areas. The optical density in the exposed areas increases with the amount and the extinction coefficient of the colorant remaining in the exposed areas and the intensity of color formed by the printing-out agent. In the non-exposed areas, it is preferred that the amount of colorant is as low as possible and that the amount of the printing-out agent is also as low as possible. The optical density can be measured in reflectance by an optical densitometer equipped with several filters (e.g., cyan, magenta, yellow). The difference in optical density at the exposed areas and the non-exposed areas has preferably a value of at least 0.3, more preferably at least 0.4, most preferably at least 0.5. There is no specific upper limit for the contrast value, but typically the contrast is less than 3.0, or even less than 2.0. In order to obtain a good contrast, selection of the type of color of the colorant is important, and preferred colors are cyan or blue colors.

Details about contrast are described in JP-A2009-516222 and WO 2007/057348, and reference can be made to these documents.

<Surfactant>

In the present invention, surfactants may be contained to enhance developability and to improve the coated surface appearance. Both polymeric and small molecule surfactants can be used as the surfactants, and nonionic surfactants are preferred. Nonionic surfactants include polymers and oligomers containing one or more polyether (such as polyethylene glycol, polypropylene glycol, and copolymers of ethylene glycol and propylene glycol) segments; block copolymers of propylene glycol and ethylene glycol (also called block copolymers of propylene oxide and ethylene oxide); ethoxylated or propoxylated acrylate oligomers; and polyethoxylated alkylphenols and polyethoxylated fatty alcohols and the like.

Surfactants that can be used include, but not limited to, the surfactants described in JP-A2009-516222 and WO 2007/057348.

The amount of the nonionic surfactants to be contained in the photosensitive layer is preferably between 0.1 and 30% by weight, more preferably between 0.5 and 20%, even more preferably between 1 and 15%.

The surfactants that may be added to the developer as described later herein can also be used.

Low-Molecular-Weight Hydrophilic Compound

The photo sensitive layer may contain a low-molecular-weight hydrophilic compound, for the purpose of improving the on-press developability without degrading the printing durability.

Examples of the low-molecular-weight hydrophilic compound, categorized as water-soluble organic compound, include glycols such as ethylene glycol, diethylene glycol, triethylene glycol, propylene glycol, dipropylene glycol, and tripropylene glycol, and ether or ester derivatives thereof; polyols such as glycerin, pentaerythritol, and tris(2-hydroxyethyl) isocyanurate; organic amines such as triethanolamine, diethanolamine, and monoethanolamine, and salts thereof; organic sulfonic acids such as alkyl sulfonic acid, toluenesulfonic acid, and benzenesulfonic acid, and salts thereof; organic sulfamic acids such as alkyl sulfamic acid, and salt thereof; organic sulfuric acids such as alkyl sulfuric acid, alkyl ether sulfuric acid, and salts thereof; organic phosphonic acids such as phenylphosphonic acid, and salt thereof; organic carboxylic acids such as tartaric acid, oxalic acid, citric acid, malic acid, lactic acid, gluconic acid, and amino acid, and salts thereof; and betaines.

Among them, at least one selected from polyols, organic sulfuric acid salts, organic sulfonic acid salts, and betaines is preferably contained in the present invention.

Specific examples of them can be found in the description at paragraphs 0137 to 0139 of JP-A2012-031400.

The content of the low-molecular-weight hydrophilic compound in the photo sensitive layer is preferably 0.5 to 20% by mass of the total solid content of the photo sensitive layer, more preferably 1 to 15% by mass, and more preferably 2 to 10% by mass. In this range, desirable levels of on-press developability and printing durability are obtained. The low-molecular-weight hydrophilic compound may be used alone, or in combination of two or more species.

Sensitizer

The image recording layer may contain a sensitizer such as phosphonium compound, nitrogen-containing low-molecular-weight compound, and ammonium group-containing polymer, aiming at improving inking performance. In particular, for the case where the protective layer contains an inorganic layered compound, the sensitizer functions as a surface coating agent of the inorganic layered compound, and prevent the inking performance from degrading in the process of printing, due to the inorganic layered compound.

Preferable examples of the phosphonium compound include those described in Japanese Laid-Open Patent Publication Nos. 2006-297907 and 2007-50660. Specific examples thereof include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio)heptane sulfate, and 1,9-bis(triphenylphosphonio)nonanenaphthalene-2,7-disulfonate.

The nitrogen-containing low-molecular-weight compound is exemplified by amine salts, and quaternary ammonium salts. Other examples include imidazolinium salts, benzoimidazolinium salts, pyrydinium salts, and quinolinium salts. Among them, quaternary ammonium salts and pyrydinium salts are preferable. Specific examples include tetramethylammonium hexafluorophosphate, tetrabutylammonium hexafluorophosphate, dodecyltrimethylammonium p-toluenesulfonate, benzyl triethylammonium hexafluorophosphate, benzyl dimethyloctylammonium hexafluorophosphate, benzyl dimethyldodecylammonium hexafluorophosphate, the compounds described in paragraphs [0021] to [0037] of Japanese Laid-Open Patent Publication No. 2008-284858, and the compounds described in paragraphs [0030] to [0057] of Japanese Laid-Open Patent Publication No. 2009-90645.

While the ammonium group-containing polymer may be arbitrarily selected so long as it has an ammonium group in the structure thereof, a preferable polymer contains, as a copolymerizable component, 5 to 80 mol % of (meth)acrylate having an ammonium group in the side chain thereof. Specific examples include the polymers described in paragraphs [0089] to [0105] of Japanese Laid-Open Patent Publication No. 2009-208458.

The ammonium salt-containing polymer preferably has a reduced specific viscosity (in ml/g), measured by the method of measurement described below, of 5 to 120, more preferably 10 to 110, and particularly 15 to 100. Mass average molecular weight, converted from the reduced specific viscosity, is preferably 10,000 to 150,000, more preferably 17,000 to 140,000, and particularly 20,000 to 130,000.

<<Method of Measuring Reduced Specific Viscosity>>

In a 20-ml measuring flask, 3.33 g (1 g as solid content) of a 30% polymer solution is weighed, and the flask is filled up with N-methylpyrrolidone. The obtained solution is allowed to stand in a thermostat chamber at 30° C. for 30 minutes, and then placed in a Ubbelohde reduced viscosity tube (viscometer constant=0.010 cSt/s), and the time it takes for the solution to elute at 30° C. is measured. The measurement is repeated twice using the same sample, to thereby find an average value. The blank (N-methylpyrrolidone only) is also measured similarly, and the reduced specific viscosity (ml/g) is calculated by the formula below.

$$\text{Reduced specific viscosity(ml/g)} = \frac{\frac{\text{Elution time of sample solution (sec)} - \text{Elution time of blank (sec)}}{\text{Elution time of blank (sec)}}}{\frac{3.33\text{ (g)} \times \frac{30}{100}}{20\text{ (ml)}}}$$

Specific examples of ammonium group-containing polymers that can be employed include those described in paragraph 0177 of JP-A2011-251431.

The content of the sensitizer is preferably 0.01 to 30.0% by mass of the total solid content of the photo sensitive layer, more preferably 0.01 to 15.0% by mass, and still more preferably 1 to 5% by mass.

Hydrophobization Precursor

The image recording layer may contain a hydrophobization precursor, for the purpose of improving the on-press developability. The hydrophobization precursor means a fine particle capable of turning, upon heating, the image recording layer into hydrophobic. The fine particle is preferably at least one species selected from hydrophobic thermoplastic polymer particle, thermoreactive polymer particle, polymer particle having polymerizable group, and microcapsule and microgel (crosslinked polymer particle) containing hydrophobic compound. Among them, polymer particle and microgel having polymerizable group are preferable.

Preferable examples of the hydrophobic thermoplastic polymer particle include those described in Research Disclosure No. 333003 published in January 1992, Japanese Laid-Open Patent Publication Nos. H09-123387, H09-131850, H09-171249, H09-171250 and European Patent No. 931647.

Specific examples of polymer composing the polymer particle include ethylene, styrene, vinyl chloride, methyl acrylate, ethyl acrylate, methyl methacrylate, ethyl methacrylate, vinylidene chloride, acrylonitrile, vinylcarbazole, acrylate or methacrylate having a polyalkylene structure, all of which being available in the form of monomer, homopolymer, copolymer and mixture. Among them, more preferable examples include polystyrene, copolymer containing styrene and acrylonitrile, and methyl polymethacrylate.

Average particle size of the hydrophobic thermoplastic polymer particle used in the present invention is preferably 0.01 to 2.0 µm.

The thermoreactive polymer particle used in the present invention is exemplified by polymer particle having a thermoreactive group which forms a hydrophobic domain as a result of crosslinking by thermal reaction and concomitant change in the functional group.

While the thermoreactive group contained in the polymer particle used in the present invention may be arbitrarily selected from those capable of proceeding any type of reaction so long as it can form a chemical bond, it is preferably a polymerizable group. The preferable examples include ethylenic unsaturated group which undergoes radical polymerization reaction (acryloyl group, methacryloyl group, vinyl group, allyl group, etc.); cation polymerizable group (vinyl group, vinyloxy group, epoxy group, oxetanyl group, etc.); isocyanate group or block thereof which undergoes addition reaction; epoxy group, vinyloxy group and functional group containing an activated hydrogen atom reactive with them (amino group, hydroxy group, carboxyl group, etc.); carboxyl group which undergoes condensation reaction, and functional group capable of reacting therewith and having a hydroxy group or amino group; and acid anhydride which undergoes ring-opening addition reaction, and amino group or hydroxy group allow to react therewith.

The microcapsule used in the present invention contains all of, or apart of, the constituents of the photo sensitive layer, typically as described in Japanese Laid-Open Patent Publication Nos. 2001-277740 and 2001-277742. The constituents of the image recording layer may also be contained outside the microcapsule. Still alternatively, the photo sensitive layer containing microcapsule may be configured so as to contain the hydrophobic constituents encapsulated in the microcapsule, and hydrophilic constituents outside the microcapsule.

The microgel used in the present invention may contain at least either therein or on the surface thereof, a part of constituents of the photo sensitive layer. In particular, an embodiment of reactive microgel, configured by attaching the radical-polymerizable group onto the surface thereof, is preferable from the viewpoint of image-forming sensitivity and printing durability.

Encapsulation of the constituents of the photo sensitive layer into the microcapsule or microgel is arbitrarily selectable from those known in the art.

Average particle size of the microcapsule or microgel is preferably 0.01 to 3.0 µm, more preferably 0.05 to 2.0 µm, and particularly 0.10 to 1.0 µm. Satisfactory levels of resolution and long-term stability may be ensured in the above-described ranges.

The content of the hydrophobization precursor is preferably 5 to 90% by mass relative to the total solid content of the photo sensitive layer.

<Other Components of Photo Sensitive Layer>

The photo sensitive layer preferably contains a chain transfer agent. The chain transfer agent adoptable herein includes a compound having SH, PH, SiH or GeH in the molecule thereof. These groups may produce a radical by donating a hydrogen to a low-active radical species, or, may produce a radical after being oxidized, followed by deprotonation. It is particularly preferable for the photo sensitive layer to contain a thiol compound (2-mercapto benzimidazoles, 2-mercapto benzthiazoles, 2-mercapto benzoxazoles, 3-mercapto triazoles, 5-mercapto tetrazoles, etc.). The photosensitive layer of the present invention can further comprise various additives, as appropriate. Additives that can be added include microcapsules for improving both developability and printing durability simultaneously, hydrophilic polymers for improving developability or improving dispersion stability of microcapsules or the like, colorants or printing-out agents for visually identifying image areas and non-image areas, polymerization inhibitors for preventing undesirable thermal polymerization of radically polymerizable compounds during preparation or storage of the photosensitive layer, higher fatty acid derivatives for preventing polymerization inhibition by oxygen, inorganic microparticles for improving the strength of cured films in image areas, hydrophilic low molecular weight compounds for improving developability, co-sensitizers or chain transfer agents for improving sensitivity, plasticizers for improving plasticity and the like. Any known such compounds can be used, including e.g. the compounds described in paragraphs [0161] to [0215] of JP-A2007-206217.

<Formation of Photo Sensitive Layer>

The photo sensitive layer according to the present invention is formed by dispersing or dissolving the above-described necessary components of the photo sensitive layer into a solvent to prepare a coating liquid, and then coating the liquid. The solvent adoptable herein is exemplified by methyl ethyl ketone, ethylene glycol monomethyl ether, 1-methoxy-2-propanol, 2-methoxyethyl acetate, 1-methoxy-2-propyl acetate, and γ-butyrolactone, but not limited thereto. The solvent may be used alone, or in combination of two or more species. The solid content of the coating liquid is preferably 1 to 50% by mass.

Preferably, the coating mass (expressed as solids) of the photosensitive layer on the support obtained after coating and drying is 0.3 to 3.0 g/m$^2$. Various coating techniques can be used. For example, bar coating, spin coating, spray coating, curtain coating, dip coating, air knife coating, blade coating, roll coating and the like are included.

<Protective Layer>

Preferably, the lithographic printing plate precursors of the present invention comprise a protective layer (oxygen barrier layer) on the photosensitive layer to block diffusion and penetration of oxygen interfering with polymerization reaction during exposure. Materials that can be used for the protective layer preferably include, for example, water-soluble polymer compounds having relatively high crystallizability, and specifically the best results are obtained in basic properties such as oxygen barrier property, developer removal and the like when polyvinyl alcohol is used as a major component.

Polyvinyl alcohol used for the protective layer may partially be substituted, at the hydroxy groups thereof, by ester, ether and acetal, so long as a certain amount of unsubstituted vinyl alcohol units, necessary for ensuring oxygen barrier performance and water-solubility, is contained. Similarly, polyvinyl alcohol may also contain other polymerizable component partially in the structure thereof. Polyvinyl alcohol may be obtained by hydrolyzing polyvinyl acetate. Specific examples of polyvinyl alcohol include those having a degree of hydrolysis of 71.0 to 100 mol %, and having a number of polymerizable repeating units of 300 to 2400. More specific examples include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and PVA L-8, all of which commercially available from Kuraray Co. Ltd. Polyvinyl alcohol may be used alone, or in the form of mixture.

In preferred embodiments, the amount of polyvinyl alcohol contained in the protective layer is 20 to 95% by weight, more preferably 30 to 90% by weight.

Further, known modified polyvinyl alcohols can also be preferably used. Especially, acid-modified polyvinyl alcohols containing a carboxylic acid group or a sulfonic acid group are preferably used. A preferred component used in mixture with polyvinyl alcohol is polyvinylpyrrolidone or a modified product thereof to improve oxygen barrier property and developer removal, and they are contained in the protective layer in an amount of 3.5 to 80% by weight, preferably 10 to 60% by weight, more preferably 15 to 30% by weight.

In addition, the protective layer can contain other components such as glycerin, dipropylene glycol and the like in an amount equivalent to several percent by weight of the (co) polymer to impart flexibility; and can further contain anionic surfactants such as sodium alkyl sulfates, sodium alkyl sulfonates and the like; amphoteric surfactants such as alkyl aminocarboxylates, alkyl aminodicarboxylates and the like; nonionic surfactants such as polyoxyethylene alkyl phenyl ethers and the like in an amount of several percent by weight of the (co)polymer.

Further, the protective layer in the lithographic printing plate precursors of the present invention preferably contains the inorganic lamellar compounds described in [0018] to [0024] of JP-A2006-106700 to improve oxygen barrier property and surface protection of the photosensitive layer. Among the inorganic lamellar compounds, synthetic swelling fluorine mica, which is a synthetic inorganic lamellar compound, is especially useful.

Preferably, the coating mass of the protective layer is in the range of 0.05 to 10 g/m$^2$ expressed as the coating mass after drying, more preferably in the range of 0.1 to 0.5 g/m$^2$ when an inorganic lamellar compound is contained, or more preferably in the range of 0.5 to 5 g/m$^2$ when an inorganic lamellar compound is not contained.

Additionally, the processes for preparing a lithographic printing plate from any one of the lithographic printing plate precursors of the present invention may comprise overall heating before exposure, during exposure or between exposure and development, as appropriate. Such heating may promote the image-forming reaction in the photosensitive layer, thereby providing advantages such as improvement in sensitivity or printing durability and stabilization of sensitivity. Further, overall post-heating or overall exposure of the developed image is also effective to improve image strength and printing durability. Typically, heating before development is preferably carried out under mild conditions at 150° C. or less. If the temperature is too high, unexposed areas cure or other problems occur. Heating after development employs very intense conditions. Typically, the temperature is in the range of 100 to 500° C. If the temperature is low, a sufficient image-strengthening effect cannot be obtained, but if it is too high, such problems as deterioration of the support or thermal decomposition of image areas occur.

Prior to the developing process described above, the lithographic printing plate precursors are exposed to laser radiation through a transparent original bearing a line image, halftone dot image or the like or imagewise exposed by laser scanning using digital data or the like.

Wavelength of light source is preferably 300 to 450 nm or 750 to 1400 nm. When the light source of 300 to 450 nm is used, the lithographic printing plate precursor preferably contains, in the photosensitive layer thereof, a sensitizing dye showing an absorption maximum in this wavelength. On the other hand, for the case where the light source of 750 to 1400 nm is used, the lithographic printing plate precursor preferably contains, in the photosensitive layer thereof, an infrared absorber, which is a sensitizing dye showing an absorption maximum in this wavelength range. The light source of 300 to 450 nm is preferably a semiconductor laser. The light source of 750 to 1400 nm is preferably a solid-state laser or semiconductor laser capable of emitting infrared radiation. An exposure mechanism may be based on any of internal drum system, external drum system, and flat bed system.

[Method of Manufacturing Lithographic Printing Plate]

The lithographic printing plate may be manufactured by exposing the lithographic printing plate precursor according to the present invention in a pattern-wise manner, followed by development.

The method of manufacturing the lithographic printing plate of the present invention include exposing the lithographic printing plate precursor according to the present invention in a pattern-wise manner; and developing the exposed lithographic printing plate precursor using a developer of pH2 to 14; wherein the development includes concomitantly-removing the unexposed area of the photosensitive layer and the protective layer, in the presence of the developer.

The method of manufacturing the lithographic printing plate of the present invention preferably includes forming a protective layer on the surface of the photosensitive layer on the side opposite to the support; and the development further includes concomitantly-removing the photosensitive layer in the unexposed area and the protective layer (excluding water washing process), under the presence of the developer additionally containing a surfactant.

A second embodiment of the method of manufacturing the lithographic printing plate of the present invention includes exposing the lithographic printing plate precursor according to the present invention in a pattern-wise manner; and removing the photosensitive layer selectively in the unexposed area, by feeding a printing ink and a fountain solution on a printing machine.

Preferable embodiments of the individual steps in the method of manufacturing the lithographic printing plate of the present invention will be explained in sequence. According to the method of manufacturing the lithographic printing plate of the present invention, the lithographic printing plate precursor according to the present invention may be manufactured for the case where of the developing includes water-washing.

The developer may be used to protect the lithographic image of a printing plate against contamination, e.g. by oxidation, fingerprints, fats, oils or dust, or damaging, e.g. by scratches. The developer preferably has a surface tension of 20 to 50 mN/m, and preferably comprises a nonionic surfactant. In this case, the layer that remains on the plate after the developing process preferably comprises between 0.005 and 20 g/m$^2$, more preferably between 0.010 and 10 g/m$^2$, even more preferably between 0.020 and 5 g/m$^2$ of a surface protective compound. A developer (gum solution) that can be used is, but not limited to, the developer described in JP-A2009-516222 and WO 2007/057348.

<Surface Protective Components in the Developer>

Further, surface protective water-soluble polymer compounds used in the developer of the present invention include soy polysaccharides, modified starches, gum arabic, dextrin, cellulose derivatives (e.g., carboxymethylcellulose, carboxyethylcellulose, methylcellulose and the like) and their modified products, pullulan, polyvinyl alcohol and derivatives thereof, polyvinylpyrrolidone, polyacrylamide and acrylamide copolymers, copolymers of vinyl methyl ether and maleic anhydride, copolymers of vinyl acetate and maleic anhydride, copolymers of styrene and maleic anhydride and the like.

The soybean polysaccharides are selectable from those known in the art, such as those commercially available under the trade name of Soyafive (from Fuji Oil Co. Ltd.) with a variety of grades. Among them, those showing a viscosity of a 10% by mass aqueous solution of 10 to 100 mPa/sec are preferably used.

Also the modified starch is selectable from those known in the art, which may be prepared for example by decomposing starch derived from corn, potato, tapioca, rice, wheat or the like by acid or enzyme, so as to give molecules having 5 to 30 glucose residues, and by adding thereto oxypropylene in an alkaline solution.

Further, the water-soluble polymer compounds may comprise homopolymers and/or copolymers of monomers containing carboxylic, sulfonic or phosphonic groups or the salts thereof, e.g. (meth)acrylic acid, vinyl acetate, styrene sulfonic acid, vinyl sulfonic acid, vinyl phosphonic acid or acrylamidopropanesulfonic acid.

Two or more of the water-soluble polymer compounds may also be used in combination. The amount of the water-soluble polymer compounds contained in the developer is preferably 0.1 to 20% by weight, more preferably 0.5 to 10% by weight.

Examples of surfactants for use as surface protective agent include anionic, cationic, amphoteric or nonionic surfactants. The gum solution may also comprise one or more of the above hydrophilic polymers as surface protective agent and, in addition, one or more surfactants to improve the surface properties of the coated layer. The surface tension of the gum solution is preferably from 20 to 50 mN/m. Nonionic surfactants are preferred.

Examples of the anionic surfactants include aliphates, abietates, hydroxyalkanesulfonates, alkanesulfonates, dialkylsulfosuccinates, straight-chain alkylbenzenesulfonates, branched alkylbenzenesulfonates, alkylnaphthalenesulfonates, alkylphenoxypolyoxyethylenepropylsulfonates, salts of polyoxyethylene alkyl sulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkyl esters, salts of alkylsulfuric esters, sulfuric esters of polyoxyethylene alkyl ethers, salts of sulfuric esters of aliphatic monoglycerides, salts of sulfuric esters of polyoxyethylene alkyl phenyl ethers, salts of sulfuric esters of polyoxyethylene styryl phenyl ethers, salts of alkylphosphoric esters, salts of phosphoric esters of polyoxyethylene alkyl ethers, salts of phosphoric esters of polyoxyethylene alkyl phenyl ethers, partially saponified compounds of styrene-maleic anhydride copolymers, partially saponified compounds of olefin-maleic anhydride copolymers, and naphthalenesulfonate-formalin condensates. Particularly preferred among these anionic surfactants are dialkylsulfosuccinates, salts of alkylsulfuric esters and alkylnaphthalenesulfonates.

Specific examples of suitable anionic surfactants include sodium dodecyl phenoxy benzene disulfonate, the sodium salt of alkylated naphthalenesulfonate, disodium methylene-dinaphthalene-disulfonate, sodium dodecyl benzene sulfonate, sulfonated alkyl diphenyl oxide, ammonium or potassium perfluoroalkylsulfonate and sodium dioctylsulfosuccinate.

Cationic surfactants used in the developer of the present invention are not specifically limited, but those previously known can be used. For example, they include alkylamine salts, quaternary ammonium salts, polyoxyethylene alkyl amine salts, and polyethylene polyamine derivatives.

Suitable examples of the nonionic surfactants include polyoxyethylene alkyl ethers, polyoxyethylene alkyl aryl ethers wherein the aryl group may be a phenyl group, a naphthyl group or an aromatic heterocyclic group, polyoxyethylene polystyryl phenyl ethers, polyoxyethylene polyoxypropylene alkyl ethers, polyoxyethylene-polyoxypropylene block polymers, partial esters of glycerin aliphatic acids, partial esters of sorbitan aliphatic acids, partial esters of pentaerythritol aliphatic acids, propylene glycol monoaliphatic esters, partial esters of sucrose aliphatic acids, partial esters of polyoxyethylene sorbitan aliphatic acids, partial esters of polyoxyethylene sorbitol aliphatic acids, polyethylene glycol aliphatic esters, partial esters of polyglycerin aliphatic acids, polyoxyethylenated castor oils, partial esters of polyoxyethylene glycerin aliphatic acids, aliphatic diethanolamides, N,N-bis-2-hydroxyalkylamines, polyoxyethylene alkylamines, triethanolamine aliphatic esters, and trialkylamine oxides. Particularly preferred among these nonionic surfactants are polyoxyethylene alkyl phenyl ethers, polyoxyethylene alkyl naphthyl ethers and polyoxyethylene-polyoxypropylene block polymers. Further, fluorinic and siliconic anionic and nonionic surfactants may be similarly used.

Two or more of the above surfactants may be used in combination. For example, a combination of two or more different anionic surfactants or a combination of an anionic surfactant and a nonionic surfactant may be preferred. The amount of such a surfactant is not specifically limited but is preferably from 0.01 to 30% by weight, more preferably from 0.05 to 20% by weight.

Amphoteric surfactants used in the developer of the present invention are not specifically limited, but include amine oxide surfactants such as alkyl dimethylamine oxides, betaine surfactants such as alkyl betaines, and amino acid surfactants such as sodium salts of alkylamino fatty acids. Especially, optionally substituted alkyl dimethylamine oxides, optionally substituted alkyl carboxybetaines, and optionally substituted alkyl sulfobetaines are preferably used. Specific examples of these surfactants that can be used include those described in paragraphs 0255 to 0278 of JP-A2008-203359, paragraphs 0028 to 0052 of JP-A2008-276166 and the like.

In the present invention, the developer used in the developing process comprises an aqueous solution at pH 2 to 14 or a surfactant. The developer preferably used in the present invention is an aqueous solution at pH 2 to 11. Preferred are aqueous solutions containing water as a major component (containing 60% by mass or more of water), particularly aqueous solutions containing a surfactant (such as an anionic, nonionic, cationic, or amphoteric surfactant) or aqueous solutions containing a water-soluble polymer compound. Also preferred are aqueous solutions containing both of a surfactant and a water-soluble polymer compound. More preferably, the developer has a pH between 5 and 10.7, even more preferably between 6 and 10.5, most preferably between 6.5 and 10.3.

The pH of the gum solution is usually adjusted with a mineral acid, an organic acid or an inorganic salt in an amount of from 0.01 to 15% by weight, preferably from 0.02 to 10% by weight. Examples of the mineral acid include nitric acid, sulfuric acid, phosphoric acid and metaphosphoric acid. Especially, organic acids are used as pH control agents and as desensitizing agents. Examples of the organic acids include carboxylic acids, sulfonic acids, phosphonic acids or salts thereof, e.g. succinates, phosphates, phosphonates, sulfates and sulfonates. Specific examples of the organic acids include citric acid, acetic acid, oxalic acid, malonic acid, p-toluenesulfonic acid, tartaric acid, malic acid, lactic acid, levulinic acid, phytic acid and organic phosphonic acid.

Preferably, the gum solution further comprises an inorganic salt. Examples of the inorganic salt include magnesium nitrate, monobasic sodium phosphate, dibasic sodium phosphate, nickel sulfate, sodium hexametaphosphate and sodium tripolyphosphate. Most preferred are alkali metal monohydrogen phosphates, alkali metal dihydrogen phosphates, and alkali metal phosphates, such as $KH_2PO_4$ or $NaH_2PO_4$, $Na_2HPO_4$, and $Na_3PO_4$. Other inorganic salts can be used as corrosion inhibiting agents, e.g. magnesium sulfate or zinc nitrate. The mineral acids, organic acids or inorganic salts may be used alone or in combination with one or more thereof.

In accordance with another embodiment of the present invention, the gum solution as developer in the processing of the plate preferably comprises a mixture of an anionic surfactant and an inorganic salt. In this mixture, the anionic surfactant is preferably an anionic surfactant having a sulfonic acid group, more preferably an alkali metal salt of a mono- or di-alkyl-substituted diphenyl ether sulfonic acid, and the inorganic salt is preferably a mono- or dibasic phosphate salt, more preferably an alkali metal monohydrogen phosphate, an alkali metal dihydrogen phosphate, or an alkali metal phosphate, such as $KH_2PO_4$ or $NaH_2PO_4$, $Na_2HPO_4$, or $Na_3PO_4$.

The developer used in the present invention may contain a pH buffering agent. For the developer of the present invention, the pH buffering agent is arbitrarily selectable without special limitation, so long as it exhibits a buffering action in the range from pH2 to 11. In the present invention, a weak alkaline buffering agent is preferably used, wherein the examples include (a) carbonate ion and hydrogen carbonate ion, (b) borate ion, (c) water-soluble amine compound and ion thereof, and combination of these ions. More specifically, (a) combination of carbonate ion and hydrogen carbonate ion, (b) borate ion, or (c) combination of water-soluble amine compound and ion thereof, for example, exhibits a pH buffering action in the developer, capable of suppressing pH from fluctuating even if the developer is used over a long period, and is therefore capable of suppressing degradation in the developability and generation of development scum due to fluctuation in pH. In the method of manufacturing the lithographic printing plate of the present invention, the combination of carbonate ion and hydrogen carbonate ion is particularly preferable.

In order to allow carbonate ion and hydrogen carbonate ion to reside in the developer, one possible method is to add a carbonate salt and a hydrogen carbonate salt into the developer, and another method is to adjust pH after the carbonate salt or hydrogen carbonate salt are added, so as to generate carbonate ion or hydrogen ion. While the carbonate salt and the hydrogen carbonate salt are not specifically limited, alkali metal salt is preferable. The alkali metal is exemplified by lithium, sodium, and potassium, wherein sodium is particularly preferable. The alkali metal may be used alone, or in combination of two or more species.

When a combination of carbonate ions and bicarbonate ions (a) is employed as a pH buffering agent, the total amount of the carbonate ions and bicarbonate ions is preferably 0.05 to 5 mol/L, more preferably 0.1 to 2 mol/L, especially preferably 0.2 to 1 mol/L based on the total mass of the aqueous solution.

The developer used in the present invention may contain an organic solvent. Examples of the organic solvent adoptable herein include aliphatic hydrocarbons (hexane, heptane, Isopar E, Isopar H, Isopar G (from Esso), etc.), aromatic hydrocarbon (toluene, xylene, etc.), halogenated hydrocarbon (methylene dichloride, ethylene dichloride, trichloroethylene, monochlorobenzene, etc.), and polar solvent.

Polar solvents include alcohols, esters, and ketones, and preferred examples thereof that can be employed include those described in paragraph 0182 of JP-A2012-031400.

When the organic solvent is insoluble in water, it may be used by solubilizing it in water using a surfactant or the like, and when the developer contains the organic solvent, the concentration of the solvent is desirably less than 40% by weight taking into account safety and inflammability.

Besides the foregoing components, the developer of the present invention can contain an antiseptic agent, a chelate compound, an anti-foaming agent, an organic acid, an inorganic acid, an inorganic salt and the like. Specifically, the compounds described in paragraphs 0266 to 0270 of JP-A2007-206217 can be preferably used.

Besides the foregoing components, the developer may contain a wetting agent. Wetting agents include, for example, ethylene glycol, propylene glycol, triethylene glycol, butylene glycol, hexylene glycol, diethylene glycol, dipropylene glycol, glycerin, trimethylol propane, diglycerin and the like. The wetting agents can be used alone or in combination with one or more thereof. In general, the foregoing wetting agents are preferably contained in an amount of from 1 to 25% by weight. Wetting agents that can be used include, but not limited to, the wetting agents described in JP-A2009-516222 and WO 2007/057348.

Further, the developer may contain a chelate compound. Calcium ions and other impurities contained in the diluting water can have adverse effects on printing and thus cause the contamination of printed matter. This problem can be eliminated by adding a chelate compound to the diluting water.

Chelate compounds include, for example, organic phosphonic acids, phosphonoalkanetricarboxylic acids and the like. Specific examples of chelate compounds include potassium or sodium salts of ethylenediaminetetraacetic acid, diethylenetriaminepentaacetic acid, triethylenetetraminehexaacetic acid, hydroxyethylethylenediaminetriacetic acid, nitrilotriacetic acid, 1-hydroxyethane-1,1-diphosphonic acid and aminotri(methylenephosphonic acid) and the like. Besides these sodium or potassium salts of these chelating agents, organic amine salts may also be used. The preferred amount of the chelate compounds to be added is from 0.001 to 5% by weight relative to the developer in diluted form. Chelate compounds that can be used include, but not limited to, the chelate compounds described in JP-A2009-516222 and WO 2007/057348.

The developer may contain an antiseptic agent and/or an anti-foaming agent. Antiseptic agents include, for example, phenol, derivatives thereof, formalin, imidazole derivatives, sodium dehydroacetate, 4-isothiazoline-3-one derivatives, benzoisothiazoline-3-one, benzotriazole derivatives, amidineguanidine derivatives, quaternary ammonium salts, pyridine derivatives, quinoline derivatives, guanidine derivatives, diazine, triazole derivatives, oxazole and oxazine derivatives, etc. The preferred amount of such an antiseptic to be added is such that it can exert a stable effect on bacteria, fungi, yeast or the like, and depending on the kind of bacteria, fungi and yeast, it is preferably from 0.01 to 4% by weight relative to the developer in diluted form. The antiseptic agents may be used alone or as a combination of two or more of them.

Anti-foaming agents include, for example, silicone anti-foaming agents. Among the antifoaming agents, either an emulsion dispersion type or solubilized type anti-foaming agent may be used. The amount of the antifoaming agent to be added is preferably from 0.001 to 1.0% by weight relative to the developer in diluted form. Antiseptic agents and anti-foaming agents that can be used include, but not limited to, the antiseptic agents and anti-foaming agents described in JP-A2009-516222 and WO 2007/057348.

Besides the foregoing components, the developer may contain an ink receptivity agent. Ink receptivity agents include, for example, turpentine oil, xylene, toluene, low heptane, solvent naphtha, kerosene, mineral spirit, hydrocarbons (e.g., a petroleum fraction having a boiling point of about 120° C. to about 250° C.), diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (e.g., dioctyl adipate, butylglycol adipate, dioctyl azelate, dibutyl sebacate, di(2-ethylhexyl) sebacate, dioctyl sebacate), epoxidated triglycerides (e.g., epoxy soybean oil), ester phosphates (e.g., tricresyl phosphate, trioctyl phosphate, trischloroethyl phosphate) and plasticizers having a solidification point of 15° C. or less and a boiling point of 300° C. or more at one atmospheric pressure such as esters of benzoates (e.g., benzyl benzoate) and the like.

Ink receptivity agents that can be used include, but not limited to, the ink receptivity agents described in JP-A2009-516222 and WO 2007/057348.

Further, the viscosity of the developer can be adjusted to e.g. between 1.7 and 5 mPa·s, by adding a viscosity increasing compound e.g. having a molecular weight between $10^4$ and $10^7$. Viscosity increasing compounds include, for example, poly(ethylene oxide), polyvinyl alcohol and the like. The viscosity increasing compounds are preferably present in a concentration of 0.01 to 10 g/l. Viscosity increasing compounds that can be used include, but not limited to, the viscosity increasing compounds described in JP-A2009-516222 and WO 2007/057348.

<Baking Gum>

In the present invention, a baking gum may be used instead of the developer. The baking gum has a similar composition to that of the developer and it is preferably a compound that does not evaporate at the usual bake temperatures. Baking gum solutions or baking gumming solutions include, for example, aqueous solutions of sodium dodecyl phenoxy benzene disulfonate, alkylated naphthalene sulfonic acid, sulfonated alkyl diphenyl oxide, methylene dinaphthalene sulfonic acid, etc., and they may contain a hydrophilic polymer component and an organic acid component, or may contain the potassium salt of hydroxyethylidene diphosphonic acid. Alternatively, they may contain a sulfosuccinamate compound and phosphoric acid.

Further, baking gums that can be used include, but not limited to, the baking gums described in JP-A2009-516222 and WO 2007/057348.

The developer described above can be used as a developer and a developer replenisher solution for exposed negative-working lithographic printing plate precursors, and it is preferably applied to the automatic processor described below. When development takes place using an automatic processor, the developer deteriorates with the amount processed and therefore a developer replenisher solution or a fresh developer may be used to restore the throughput.

The developing process using an aqueous solution at pH 2 to 11 in the present invention can be more conveniently performed by an automatic processor equipped with a means for supplying the developer and a rubbing member. An automatic processor using a rotating brush roll as a rubbing member is especially preferred.

Further, the automatic processor preferably comprises a means for removing an excess of the developer such as a squeeze roller or the like, and a drying mean such as a hot air dryer or the like downstream of the developing means.

<Exposure>

The method of manufacturing the lithographic printing plate of the present invention includes exposing the lithographic printing plate precursor according to the present invention in a pattern-wise manner. The lithographic printing plate precursor according to the present invention is exposed by laser shot through a transparent original having a line image or halftone image or the like, or laser scanning modulated by digital data.

Wavelength of light source is preferably 300 to 450 nm or 750 to 1400 nm. When the light source of 300 to 450 nm is used, the lithographic printing plate precursor preferably contains, in the photosensitive layer thereof, a sensitizing dye showing an absorption maximum in this wavelength. On the other hand, for the case where the light source of 750 to 1400 nm is used, the lithographic printing plate precursor preferably contains, in the photosensitive layer thereof, an infrared absorber, which is a sensitizing dye showing an absorption maximum in this wavelength range. The light source of 300 to 450 nm is preferably a semiconductor laser. The light source of 750 to 1400 nm is preferably a solid-state laser or semiconductor laser capable of emitting infrared radiation. The infrared laser preferably has an output of 100 mW or larger, exposure time per pixel is preferably 20 microseconds or shorter, and exposure energy is preferably 10 to 300 mJ/cm$^2$. A multi-beam laser device is preferably used in order to shorten the exposure time. An exposure mechanism may be based on any of internal drum system, external drum system, and flat bed system.

The pattern-wise exposure may be proceeded by a general method using a plate setter, for example. When the on-machine development is adopted, the lithographic printing plate precursor may be set on a printing machine and may be exposed pattern-wise on the printing machine <Preheating>

Additionally, the processes for preparing a lithographic printing plate from any one of the lithographic printing plate precursors of the present invention may comprise overall heating before exposure, during exposure or between exposure and development, as appropriate. Such heating may promote the image-forming reaction in the photosensitive layer, thereby providing advantages such as improvement in sensitivity or printing durability and stabilization of sensitivity. Further, overall post-heating or overall exposure of the developed image is also effective to improve image strength and printing durability. This preheating is preferably carried out within a time period of less than 10 minutes, more preferably less than 5 minutes, even more preferably less than 1 minute. This preheating is especially preferably carried out immediately after exposure, i.e., within less than 30 seconds. There is no specific time limit before the heating may start, but the precursor is transported to a preheating unit and heating is started in such a manner that it may be heated as soon as possible after exposure. This heating takes place at a temperature of preferably 80° C. to 150° C. and for a period of preferably 5 seconds to 1 minute. Typically, heating before development is preferably carried out under mild conditions at 150° C. or less. If the temperature is too high, unexposed areas cure or other problems occur. Heating after development employs very intense conditions. Typically, the temperature is in the range of 100 to 500° C. If the temperature is low, a sufficient image-strengthening effect cannot be obtained, but if it is too high, such problems as deterioration of the support or thermal decomposition of image areas occur. The preheating unit is provided with heating elements such as IR-lamps, UV-lamps, heated air, a heated metal roll and the like. Details about preheating are described in JP-A2009-516222 and WO 2007/057348, and reference can be made to these documents.

<Development>

The development may be implemented by (1) a method of development using a developer of pH2 to 14 (developer process), or (2) a method of development on a printing machine, while feeding fountain solution and/or ink (on-machine development).

(Developer Process)

In the developer process, the lithographic printing plate precursor is treated using the developer of pH2 to 14, so as to remove the photosensitive layer in non-exposed areas, and thereby lithographic printing plate is manufactured.

In a general process of development using a strong alkaline developer (pH12 or above), the protective layer is removed by pre-water washing, subjected to alkaline development, post-water washing for removing alkali by water washing, gum solution treatment, and drying process, to thereby obtain the lithographic printing plate. According to a first preferable embodiment of the present invention, the developer used herein has pH value of 2 to 14. In this embodiment, the developer preferably contains a surfactant or water-soluble polymer compound, so as to concomitantly allow the development and gum solution treatment to proceed. Accordingly, the post-water washing is not indispensable, and the development and the gum solution treatment may be proceeded in a single solution.

Also the pre-water washing is not indispensable, so that also the removal of the protective layer may be proceeded concomitantly with the gum solution treatment. In the method of manufacturing the lithographic printing plate of the present invention, the development and gum solution treatment is preferably followed by removal of excessive developer using a squeeze roller for example, and drying.

The development by developer in the lithographic printing plate precursor of the present invention may be proceeded as usual at 0 to 60° C., preferably 15 to 40° C. or around, typically by a method of dipping the exposed lithographic printing plate precursor into a developer followed by rubbing with a brush, or a method of spraying a developer followed by rubbing with a brush.

The development using the developer is successfully implemented on an automatic processor, equipped with a developer feeder and a rubbing member. The automatic processor having rotating brush rollers as the rubbing member is particularly preferable. The automatic processor preferably has a unit for removing excessive developer, such as squeeze rollers, and a drying unit such as a hot air blower, on the downstream side of the developing unit. Moreover, the automatic processor may have a pre-heating unit for heating the exposed lithographic printing plate precursor, on the upstream side of the developing unit.

The example of the automatic processor used for the method of manufacturing a lithographic printing plate of the present invention is illustrated in FIG. 1. The automatic processor illustrated in FIG. 1 is basically composed of a developing unit 6 and a drying unit 10, wherein the lithographic printing plate precursor 4 is developed in the developing tank 20, and dried in the drying unit 10.

Figure 2:
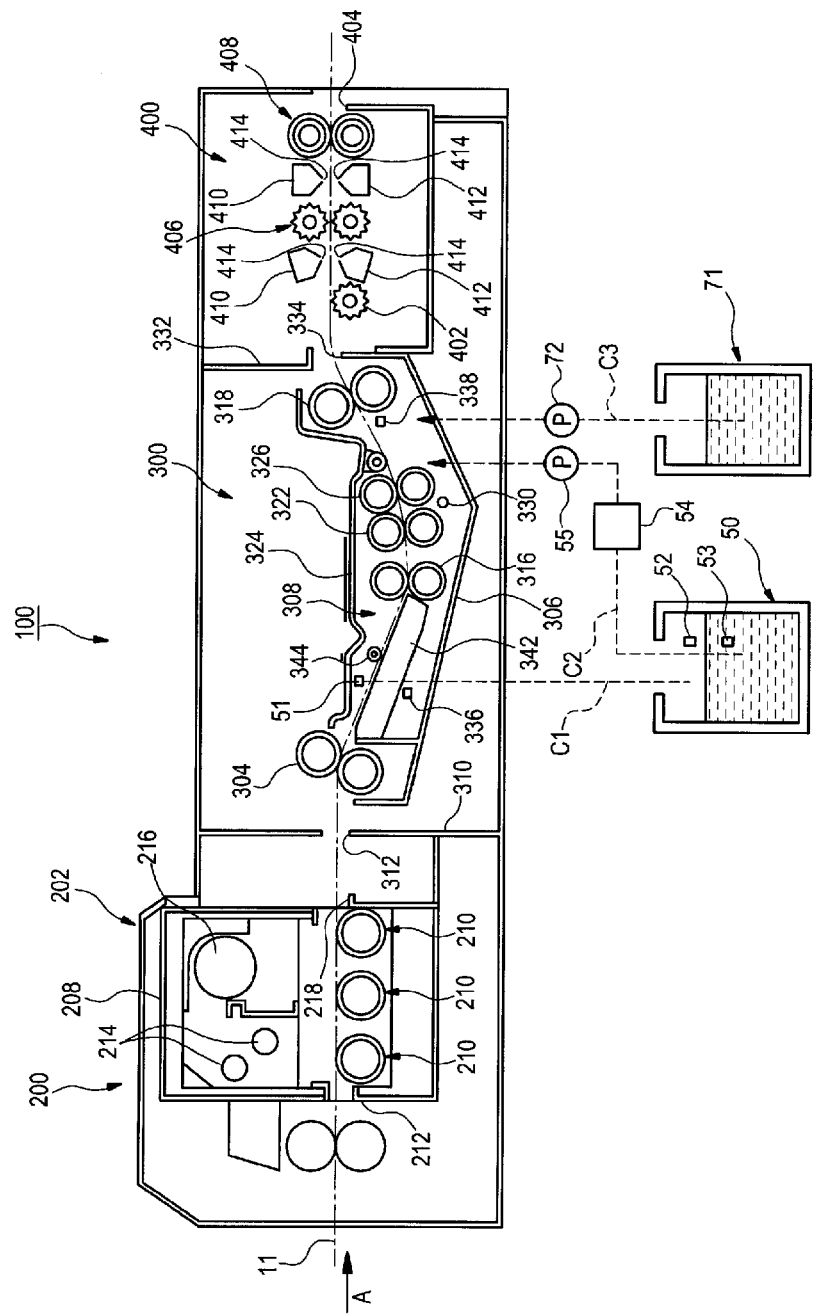
FIG. 2 is an explanatory drawing illustrating another exemplary configuration of the automatic processor.

The automatic processor 100 illustrated in FIG. 2 is composed of a chamber shaped by an equipment frame 202, and has a pre-heating section 200, a developing section 300 and a drying section 400 aligned in line in the direction of a feed path 11 along which the lithographic printing plate precursor is fed (indicated by arrow A).

The pre-heating section 200 has a heating chamber 208 with a feeding port 212 and an output port 218, and has tandem rollers 210, heaters 214 and a circulating fan 216 arranged therein.

The developing section 300 is partitioned by an outer panel 310 from the pre-heating section 200, and the outer panel 310 has an insertion slit 312.

Inside the developing section 300, there is provided a process tank 306 having therein a developing tank 308 filled with a developer, and an insertion roller pair 304 for guiding the lithographic printing plate precursor into the process tank 306. The upper portion of the developing tank 308 is covered with a shielding lid 324.

Inside the developing tank 308, there is provided a guide roller 344 and a guiding member 342, an immersed roller pair 316, a brush roller pair 322, a brush roller pair 326, and an output roller pair 318 which are aligned in sequence from the upstream side of the feeding direction. The lithographic printing plate precursor brought into the developing tank 308 is dipped in the developer, and allowed to pass through the rotating brush roller pairs 322, 326, to be removed with the non-image-forming area.

Below the brush roller pairs 322, 326, there is provided a spray 330. The spray pipe 330 is connected to a pump (not illustrated), and the developer in the developing tank 308 sucked up by the pump is ejected through the spray pipe 330 into the developing tank 308.

On the sidewall of the developing tank 308, there is provided an overflow port 51 opened at the top end portion of a first circulating pipe C1, so as to allow an excessive portion of the developer to flow into the overflow port 51, run down through the first circulating pipe C1, to be discharged into an external tank 50 provided outside the developing section 300.

The external tank 50 is connected to a second circulating pipe C2. The second circulating pipe C2 is provided with a filter unit 54 and a developer feed pump 55. By the developer feed pump 55, the developer is fed from the external tank 50 to the developing tank 308. The external tank 50 is provided with a upper level gauge 52 and a lower level gauge 53.

The developing tank 308 is connected through a third circulating pipe C3 to a supplementary water tank 71. The third circulating pipe C3 is provided with a water supplement pump 72 by which water reserved in the supplementary water tank 71 is fed to the developing tank 308.

A liquid temperature sensor 336 is provided on the upstream side of the immersed roller pair 316, and a level gauge 338 is provided on the upstream side of the output roller pair 318.

A partition board 332 placed between the developing section 300 and the drying section 400 has an insertion slit 334 provided thereto. On a path between the developing section 300 and the drying section 400, there is provided a shutter (not illustrated) which closes the path when the lithographic printing plate precursor 11 does not travel on the path.

The drying section 400 has a support roller 402, ducts 410, 412, a feed roller pair 406, ducts 410, 412, and a feed roller pair 408 aligned therein in sequence. Each of the ducts 410, 412 has a slit hole 414 provided to the tip thereof. The drying section 400 has provided thereto an unillustrated drying unit such as a hot air blower, heat generator or the like. The drying section 400 has a discharge port 404, through which the lithographic printing plate dried by the drying unit is ejected.

In the present invention, the developer used in the developing process comprises an aqueous solution at pH 2 to 14 or a surfactant. The developer preferably used in the present invention is an aqueous solution at pH 2 to 11. Preferred are aqueous solutions containing water as a major component (containing 60% by mass or more of water), particularly aqueous solutions containing a surfactant (such as an anionic, nonionic, cationic, or amphoteric surfactant) or aqueous solutions containing a water-soluble polymer compound. Also preferred are aqueous solutions containing both of a surfactant and a water-soluble polymer compound. More preferably, the developer has a pH between 5 and 10.7, even more preferably between 6 and 10.5, most preferably between 6.5 and 10.3.

<On-Machine Development System>

In the on-machine development system, the lithographic printing plate precursor after pattern-wise exposure is fed, on a printing machine, with an oil-based ink and water-based component, so as to remove the photosensitive layer selectively in the non-image-forming area, to thereby give a lithographic printing plate.

More specifically, the lithographic printing plate precursor is exposed pattern-wise and then set on the printing machine without development, or, the lithographic printing plate precursor is set on the printing machine and then exposed pattern-wise on the printing machine. Next, printing is started by feeding the oil-based ink and the water-based component. In the non-image-forming area, the uncured photosensitive layer is removed in the early stage of printing, by dissolution or dispersion with the aid of the oil-based ink and/or water-based component fed thereto, and thereby the hydrophilic surface exposes in the area. On the other hand, in the light-exposed area, the photosensitive layer cured by exposure forms an acceptance sites for oil-based ink where a lipophilic surface exposes. While it is arbitrary which of the oil-based ink and the water-based component is the first to be fed onto the surface of plate, it is more preferable to feed the oil-based ink first, in view of preventing the water-based component from being contaminated by components of the removed photosensitive layer. In this way, the lithographic printing plate precursor is developed on the printing machine, and is directly used in a large number of impressions. The oil-based ink and the water-based component are preferably a printing ink and fountain solution, respectively, which are used for general planographic printing.

In the method of manufacturing a lithographic printing plate from a lithographic printing plate precursor according to the present invention, the entire surface of the lithographic printing plate precursor may be heated before exposure, or during exposure, or between exposure and development, irrespective of the development style. By the heating, the image forming reaction in the recording layer may be accelerated, to thereby advantageously improve the sensitivity and printing durability, and stabilize the sensitivity. For the development by developer, it is also effective to subject the developed plate to post-heating or exposure over the entire surface, aiming at improving the strength of the image-forming area and printing durability. In general, the pre-heating is preferably proceeded under a mild condition typically at 150° C. or lower. Too high temperature may result in curing of the non-image-forming area. On the other hand, the post-heating after development needs a very strong condition, typically at 100 to 500° C. Too low temperature may result in insufficient strength of the image-forming area, whereas too high temperature may degrade the support, or decompose the image-forming area.

Features of the present invention will further be detailed referring to Examples. Note that the amount of use, ratio, details of processes, and procedures of processes described in Examples below may be arbitrarily modified, without departing from the spirit of the present invention. The scope of the present invention is, therefore, not restrictively understood by the specific examples described below. As used in the Examples below with reference to the amounts added, the term "parts" means "parts by weight" unless otherwise specified.

[Preparation of Lithographic Printing Plate Precursors]
<Preparation of Support 1>

An aluminum plate having a thickness of 0.24 mm (grade 1050, temper H16) was degreased by immersion in an aqueous solution of 5% sodium hydroxide kept at 65° C. for 1 minute, and then washed with water. This degreased aluminum plate was neutralized by immersion in an aqueous solution of 10% hydrochloric acid kept at 25° C. for 1 minute, and then washed with water. Then, this aluminum plate was subjected to an electrolytic surface-roughening treatment using AC at a current density of 100 A/dm² in an aqueous solution of 0.3% by mass of hydrochloric acid at 25° C. for 60 seconds, and then desmutted in an aqueous solution of 5% sodium hydroxide kept at 60° C. for 10 seconds. The surface-roughened and desmutted aluminum plate was subjected to an anodization treatment in an aqueous solution of 15% sulfuric acid at 25° C. under conditions of a current density of 10 A/dm² and a voltage of 15 V for 1 minute, and further subjected to a hydrophilization treatment using an aqueous solution of 1% poly(vinyl phosphonic acid) at 75° C. to prepare a support. Its surface roughness was determined to be 0.44 μm (expressed as Ra according to JIS B0601).

<Formation of Photosensitive Layers (1) to (52)>

Each coating solution for photosensitive layers having the composition shown in the table below was applied using a bar coater on the support described above, and then dried in an oven at 90° C. for 60 seconds to form photosensitive layers having a coating mass of 1.0 g/m² after drying except that photosensitive layers 49 to 50, and 52 were formed by drying in an oven at 100° C. for 60 seconds.

<Coating Solutions for Photosensitive Layers>

| | |
|---|---|
| Binder polymer (1) shown below (acrylic resin (D)) (weight average molecular weight: 50,000) | 0.06 g |
| Polyvinyl acetal binder polymer indicated in the table below | 0.19 g |
| Polymerizable compound (1) shown below (PLEX6661-O from Degussa Japan Co., Ltd.) | 0.17 g |
| Polymerizable compound (2) shown below | 0.51 g |
| Sensitizing dye (1) shown below | 0.03 g |
| Sensitizing dye (2) shown below | 0.015 g |
| Sensitizing dye (3) shown below | 0.015 g |
| Polymerization initiator (1) shown below | 0.13 g |
| Chain transfer agent: mercaptobenzothiazole | 0.01 g |
| Dispersion of a ε-phthalocyanine pigment (containing 15 parts by mass of the pigment, 10 parts by mass of a dispersing agent (allyl methacrylate/methacrylic acid copolymer (weight average molecular weight: 60,000, molar ratio: 83/17)), and 15 parts by mass of cyclohexanone) | 0.40 g |
| Thermal polymerization inhibitor (N-nitrosophenylhydroxylamine aluminum salt) | 0.01 g |
| Water-soluble fluorosurfactant (1) shown below (weight average molecular weight: 10,000) | 0.001 g |
| 1-Methoxy-2-propanol | 3.5 g |
| Methyl ethyl ketone | 8.0 g |

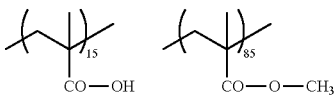

Binder polymer (1)
(The acid value is 85 mgKOH/g.)

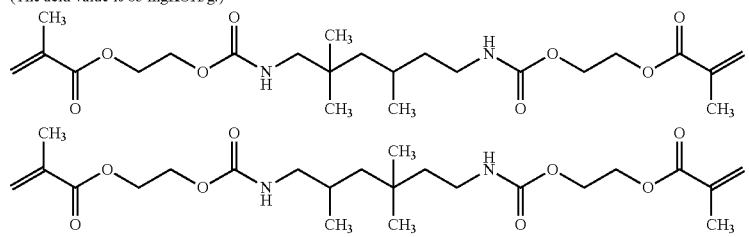

Polymerizable compound (1)
[The mixture of the isomers]

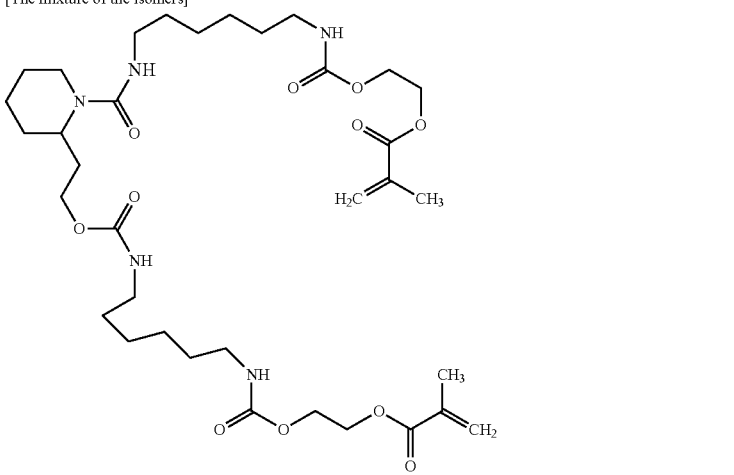

Polymerizable compound (2)

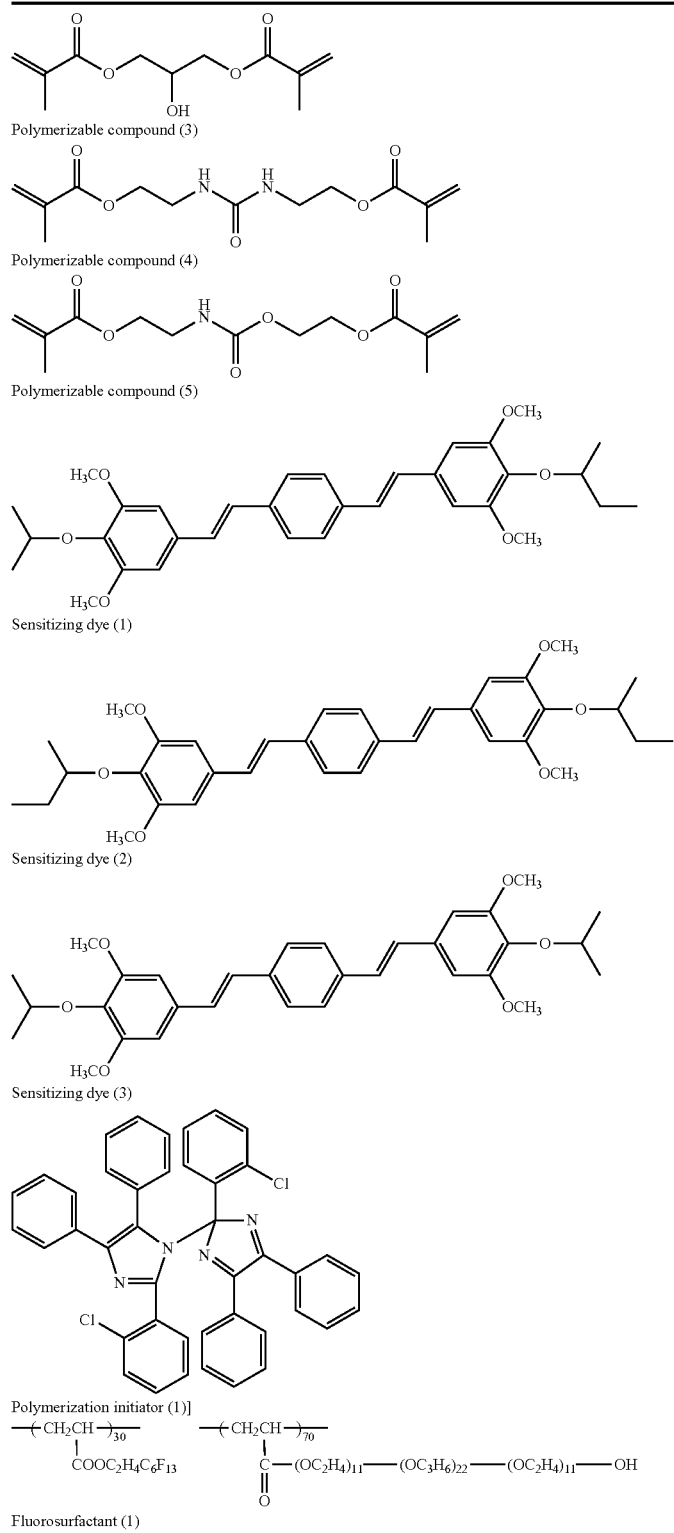

The type of the polyvinyl acetal binder used in each solution for photosensitive layers is shown below. The polymerizable compound (A) used was any one or more of the polymerizable compounds (1) to (3) shown above. The coating solution for photosensitive layer (4) was prepared by adding the polymerizable compound (1) in place of the polymerizable compound (2) in the coating solution for photosensitive layer (1). The coating solution for photosensitive layer (50) was prepared by adding the polymerizable compound (3) shown below in place of the polymerizable compounds (1) and (2) in the coating solution for photosensitive layer (1). The coating solution for photosensitive layer 52 was prepared by adding the binder polymer (1) (acrylic resin) in place of the polyvinyl acetal binder polymer (C).

TABLE 1

| Solution for photosensitive layers | (C)Polyvinyl-acetal binder | (A)Polymerizable compound | (D)Acrylic resin |
|---|---|---|---|
| 1 | P-01 | 1, 2 | 1 |
| 2 | P-02 | 1, 2 | 1 |
| 3 | P-03 | 1, 2 | 1 |
| 4 | P-04 | 1, 2 | 1 |
| 5 | P-05 | 1, 2 | 1 |
| 6 | P-06 | 1, 2 | 1 |
| 7 | P-07 | 1, 2 | 1 |
| 8 | P-08 | 1, 2 | 1 |
| 9 | P-09 | 1, 2 | 1 |
| 10 | P-10 | 1, 2 | 1 |
| 11 | P-11 | 1, 2 | 1 |
| 12 | P-12 | 1, 2 | 1 |
| 13 | P-13 | 1, 2 | 1 |
| 14 | P-14 | 1, 2 | 1 |
| 15 | P-15 | 1, 2 | 1 |
| 16 | P-16 | 1, 2 | 1 |
| 17 | P-17 | 1, 2 | 1 |
| 18 | P-18 | 1, 2 | 1 |
| 19 | P-19 | 1, 2 | 1 |
| 20 | P-20 | 1, 2 | 1 |
| 21 | P-21 | 1, 2 | 1 |
| 22 | P-22 | 1, 2 | 1 |
| 23 | P-23 | 1, 2 | 1 |
| 24 | P-24 | 1, 2 | 1 |
| 25 | P-25 | 1, 2 | 1 |
| 26 | P-26 | 1, 2 | 1 |
| 27 | P-27 | 1, 2 | 1 |
| 28 | P-28 | 1, 2 | 1 |
| 29 | P-29 | 1, 2 | 1 |
| 30 | P-30 | 1, 2 | 1 |
| 31 | P-31 | 1, 2 | 1 |
| 32 | P-32 | 1, 2 | 1 |
| 33 | P-33 | 1, 2 | 1 |
| 34 | P-34 | 1, 2 | 1 |
| 35 | P-35 | 1, 2 | 1 |
| 36 | P-36 | 1, 2 | 1 |
| 37 | P-37 | 1, 2 | 1 |
| 38 | P-38 | 1, 2 | 1 |
| 39 | P-39 | 1, 2 | 1 |
| 40 | P-40 | 1, 2 | 1 |
| 41 | C-1 | 1, 2 | 1 |
| 42 | C-2 | 1, 2 | 1 |
| 43 | C-3 | 1, 2 | 1 |
| 44 | C-4 | 1, 2 | 1 |
| 45 | C-5 | 1, 2 | 1 |
| 46 | C-6 | 1, 2 | 1 |
| 49 | P-27 | Only 1 | 1 |
| 50 | P-27 | Only 3 | 1 |
| 51 | P-27 | 1, 2 | Non |
| 52 | Non | 1, 2 | 1 |
| 61 | P-27 | Only 2 | 1 |
| 62 | P-27 | Only 4 | 1 |
| 63 | P-27 | Only 5 | 1 |
| 64 | P-41 | 1, 2 | 1 |
| 65 | P-42 | 1, 2 | 1 |
| 66 | P-43 | 1, 2 | 1 |

TABLE 2

| Unit is mol % | Molecular weight (ten-thousand) | (1,3-dioxane with nPr) | OAc | OH | O-CO-CH2CH2-COOH | O-CO-C6H4-(COONa)2 |
|---|---|---|---|---|---|---|
| P-01 | 8.7 | 40 | 10 | 20 | | 5 |
| P-02 | 3.1 | 45 | 15 | 10 | 10 | |
| P-03 | 6.2 | 60 | 8 | 20 | | 5 |
| P-04 | 3.3 | 50 | 4 | 15 | 5 | |
| P-05 | 2.9 | 57 | 7 | 20 | | 5 |
| P-06 | 4.0 | 61 | 1 | 10 | 5 | |
| P-07 | 3.5 | 64 | 6 | 5 | | 5 |
| P-08 | 7.6 | 65 | 8 | 2 | 15 | |
| P-09 | 10.0 | 70 | 7 | 9 | | 9 |
| P-10 | 7.6 | 50 | 7 | 2 | 31 | |
| P-11 | 9.6 | 47 | 4 | 1 | | 32 |
| P-12 | 3.9 | 55 | 7 | 11 | 6 | |
| P-13 | 9.0 | 64 | 4 | 11 | | 16 |
| P-14 | 6.1 | 69 | 4 | 4 | 14 | |
| P-15 | 6.3 | 62 | 5 | 7 | | 11 |
| P-16 | 7.6 | 46 | 7 | 8 | 18 | |
| P-17 | 5.3 | 59 | 3 | 14 | | 18 |
| P-18 | 5.8 | 52 | 8 | 2 | 28 | |
| P-19 | 4.3 | 55 | 3 | 12 | | 14 |
| P-20 | 8.9 | 60 | 1 | 6 | 12 | |

| Unit is mol % | a-1 | a-2 | b-1 | b-2 | b-3 | b-4 | b-5 | b-6 | c-1 | c-2 | c-3 | c-4 | c-5 | c-6 | c-7 | c-8 | c-9 | c-10 | c-11 | c-12 |
|---|---|---|---|---|---|---|---|---|---|---|---|---|---|---|---|---|---|---|---|---|
| P-01 | 25 | | | | | | | | | | | | | | | | | | | |
| P-02 | | 20 | | | | | | | | | | | | | | | | | | |
| P-03 | | | 7 | | | | | | | | | | | | | | | | | |
| P-04 | | | | 26 | | | | | | | | | | | | | | | | |
| P-05 | | | | | 10 | | | | | | | | | | | | | | | |
| P-06 | | | | | | 22 | | | | | | | | | | | | | | |
| P-07 | | | | | | | 21 | | | | | | | | | | | | | |
| P-08 | | | | | | | | 10 | | | | | | | | | | | | |
| P-09 | | | | | | | | | 5 | | | | | | | | | | | |
| P-10 | | | | | | | | | | 10 | | | | | | | | | | |

TABLE 2-continued
| | | | | | | | | |
|---|---|---|---|---|---|---|---|---|
| P-11 | 15 | | | | | | | |
| P-12 | | 20 | | | | | | |
| P-13 | | | 5 | | | | | |
| P-14 | | | | 10 | | | | |
| P-15 | | | | | 15 | | | |
| P-16 | | | | | | 20 | | |
| P-17 | | | | | | | 5 | |
| P-18 | | | | | | | | 10 |
| P-19 | | | | | | | | 15 |
| P-20 | | | | | | | | 20 |
TABLE 3
| Unit is mol % | Molecular weight (ten-thousand) | 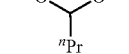 | 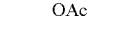 OAc | 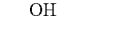 OH | 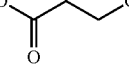 COOH |  COONa / COONa |
|---|---|---|---|---|---|---|
| P-21 | 3.4 | 60 | 7 | 9 | | 19 |
| P-22 | 8.9 | 43 | 5 | 11 | 30 | |
| P-23 | 2.7 | 60 | 9 | 7 | | 9 |
| P-24 | 3.8 | 53 | 10 | 4 | 13 | |
| P-25 | 3.4 | 64 | 6 | 6 | | 19 |
| P-26 | 6.4 | 58 | 10 | 4 | 18 | |
| P-27 | 8.9 | 55 | 7 | 9 | | 24 |
| P-28 | 9.7 | 53 | 3 | 4 | 30 | |
| P-29 | 7.7 | 67 | 9 | 9 | | |
| P-30 | 7.7 | 47 | 6 | 2 | 25 | |
| P-31 | 6.3 | 51 | 4 | 5 | | 35 |
| P-32 | 7.7 | 48 | 8 | 2 | 32 | |
| P-33 | 6.7 | 63 | 6 | 5 | | 11 |
| P-34 | 4.7 | 42 | 7 | 12 | 19 | |
| P-35 | 7.5 | 60 | 8 | 13 | | 13 |
| P-36 | 7.3 | 64 | 1 | 14 | 11 | |
| P-37 | 6.4 | 58 | 8 | 14 | | 4 |
| P-38 | 8.6 | 61 | 5 | 8 | 6 | |
| P-39 | 7.6 | 40 | 8 | 6 | | 11 |
| P-40 | 8.3 | 59 | 5 | 4 | 2 | |
| P-41 | 8.9 | 55 | 7 | 9 | 24 | |
| P-42 | 8.9 | 55 | 7 | 9 | 24 | |
| P-43 | 8.9 | 55 | 7 | 9 | 24 | |
| C-1 | 3.5 | 65 | 9 | 8 | | 5 |
| C-2 | 4.6 | 67 | 6 | 2 | 5 | |
| C-3 | 5.7 | 51 | 7 | 14 | | 10 |
| C-4 | 8.2 | 60 | 1 | 12 | 5 | |
| C-5 | 6.7 | 55 | 10 | 6 | | 5 |
| Unit is mol % | d-1 | d-2 | d-3 | d-4 | d-5 | d-6 | e-1 | e-2 | e-3 | e-4 | z-1 | z-2 | z-3 | z-4 | z-5 |
|---|---|---|---|---|---|---|---|---|---|---|---|---|---|---|---|
| P-21 | 5 | | | | | | | | | | | | | | |
| P-22 | | 10 | | | | | | | | | | | | | |
| P-23 | | | 15 | | | | | | | | | | | | |
| P-24 | | | | 20 | | | | | | | | | | | |
| P-25 | | | | | 5 | | | | | | | | | | |
| P-26 | | | | | | 10 | | | | | | | | | |
| P-27 | | | | | | | 5 | | | | | | | | |
| P-28 | | | | | | | | 10 | | | | | | | |
| P-29 | | | | | | | | | 25 | | | | | | |
| P-30 | | | | | | | | | | 20 | | | | | |
| P-31 | | | | | | | 5 | | | | | | | | |
| P-32 | | | | | | | | 10 | | | | | | | |
| P-33 | | | | | | | | | 15 | | | | | | |
| P-34 | | | | | | | | | | 20 | | | | | |
| P-35 | | | | | | | 5 | | | | | | | | |
| P-36 | | | | | | | | 10 | | | | | | | |
| P-37 | | | | | | | | | 15 | | | | | | |
| P-38 | | | | | | | | | | 20 | | | | | |
| P-39 | | | | | | | | | 35 | | | | | | |
| P-40 | | | | | | | | | | 30 | | | | | |
| P-41 | | | | | | | | | | | 5 | | | | |
| P-42 | | | | | | | | | | | | 5 | | | |
| P-43 | | | | | | | | | | | | | 5 | | |
| C-1 | | | | | | | | | | | | | | 13 | |
| C-2 | | | | | | | | | | | | | | | 20 |

TABLE 3-continued

| | | |
|---|---|---|
| C-3 | 19 | |
| C-4 | | 21 |
| C-5 | | 25 |

C-6
Molecular weight is 55,000.

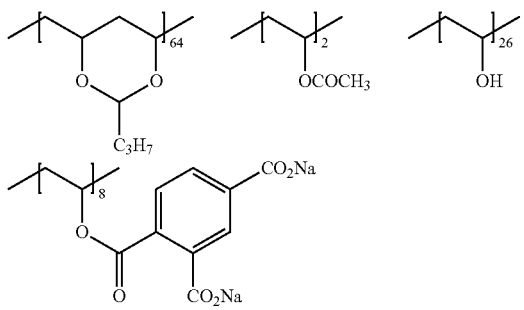

In the tables above, the molecular weight refers to weight average molecular weight. The repeat unit forming a part of each polymer and its molar ratio are shown. The repeat units (a-1) to (e-4) were shown above. On the other hand, the repeat units (z-1) to (z-5) are shown below.

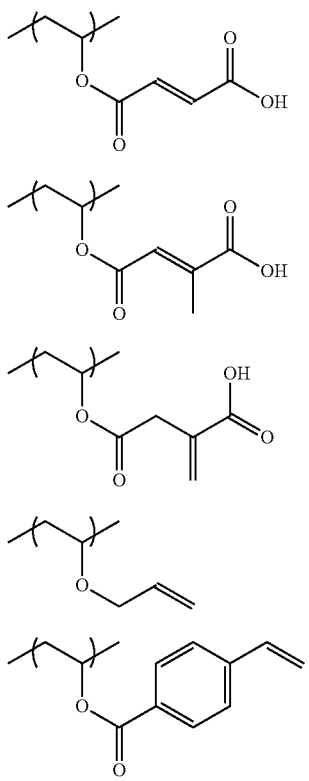

<Thermal Development>
[Formation of Photosensitive Layers (53) to (60)]
Each coating solution for photosensitive layers 2' having the composition shown below was applied on the primer layer described above using a bar coater, and then dried in an oven at 100° C. for 60 seconds to form photosensitive layers 2. The coating solutions for photosensitive layers 2' were prepared by mixing each coating solution for photosensitive layers (2) and the hydrophobizing solution (1) shown below and stirring the mixture immediately before it was applied.

<Coating Solutions for Photosensitive Layers (53) to (60)>

| | |
|---|---|
| Binder polymer (1) shown below (acrylic resin (D)) (weight average molecular weight: 50,000) | 0.032 g |
| Polyvinyl acetal binder polymer indicated in the table above | 0.19 g |
| Infrared absorbing dye (1) shown below | 0.030 g |
| Free radical generator (1) shown below | 0.162 g |
| Polymerizable compound (1) shown above (PLEX6661-O from Degussa Japan Co., Ltd.) | 0.17 g |
| Polymerizable compound (2) shown above | 0.51 g |
| PIONIN A-20 (from TAKEMOTO OIL & FAT Co., Ltd.) | 0.055 g |
| Oil-sensitizer (1) shown below | 0.044 g |
| Fluorosurfactant(1) shown above | 0.008 g |
| Methyl ethyl ketone | 1.091 g |
| 1-Methoxy-2-propanol | 8.609 g |

<Hydrophobizing solution (1)>

| | |
|---|---|
| Aqueous dispersion of hydrophobizing agent (1) shown below | 2.640 g |
| Distilled water | 2.425 g |

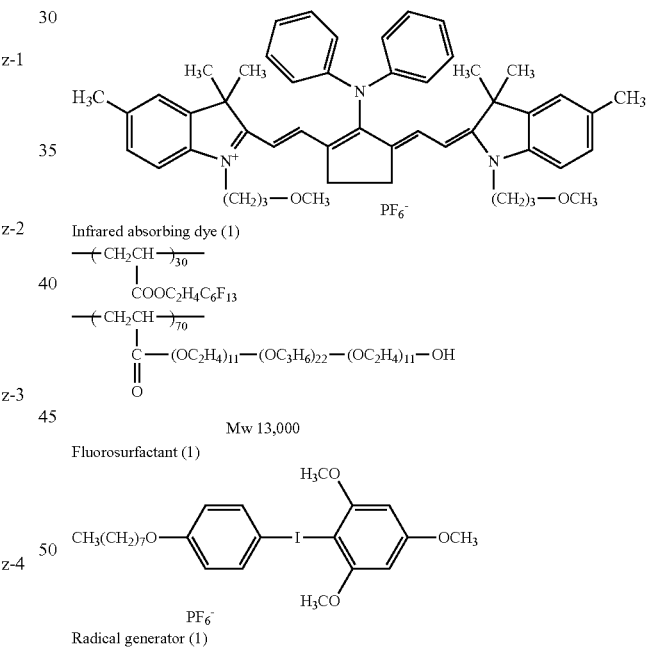

(Preparation of an Aqueous Dispersion of Hydrophobizing Agent (1))

A 1000-ml four-neck flask equipped with a stirrer, a thermometer, a dropping funnel, a nitrogen inlet, and a reflux condenser was charged with distilled water (350 mL) under deoxygenation by nitrogen gas purging and heated until the internal temperature reached 80° C. To this were added sodium dodecyl sulfate (1.5 g) as a dispersing agent, and ammonium persulfide (0.45 g) as an initiator, and then a mixture of glycidyl methacrylate (45.0 g) and styrene (45.0 g) was added dropwise via the dropping funnel over about one hour. After completion of the dropwise addition, the reaction was continued for 5 hours, and then unreacted monomers were removed by steam distillation. Then, the mixture was cooled and adjusted to pH 6 with aqueous ammonia, and finally pure water was added to reduce non-volatiles to 15% by mass, thereby giving an aqueous dispersion of hydrophobizing agent (1) consisting of polymer microparticles. The particle size distribution of the polymer microparticles had a maximum at a particle size of 60 nm.

The particle size distribution was determined by taking an electron micrograph of the polymer microparticles and measuring the particle size of a total of 5000 microparticles on the photograph, and plotting the frequency of appearance of each of 50 particle sizes on a logarithmic scale from the maximum to zero of the measured particle sizes. The particle sizes of nonspherical particles were determined as the particle sizes of spherical particles having the same particle areas as those on the photograph.

TABLE 4

| Solution for photosensitive layers | (C)Polyvinyl-acetal binder | (A)Polymerizable compound | (D)Acrylic resin |
|---|---|---|---|
| 53 | P-1 | 1, 2 | 1 |
| 54 | P-3 | 1, 2 | 1 |
| 55 | P-9 | 1, 2 | 1 |
| 56 | P-21 | 1, 2 | 1 |
| 57 | P-27 | 1, 2 | 1 |
| 58 | C-1 | 1, 2 | 1 |
| 59 | C-4 | 1, 2 | 1 |
| 60 | C-6 | 1, 2 | 1 |

<Formation of Protective Layer 1>

A coating solution for protective layer (1) having the composition shown below was applied using a bar coater on the surface of each photosensitive layer prepared as described above, and then dried at 125° C. for 70 seconds to form a protective layer.

Coating Solution for Protective Layer (1)

| | |
|---|---|
| PVA-205 | 0.658 g |
| (Partially hydrolyzed polyvinyl alcohol from KURARAY CO., LTD., having a degree of saponification of 86.5 to 89.5 mol %, and a viscosity of 4.6 to 5.4 mPa · s (in an aqueous solution of 4% by mass at 20° C.)) | |
| PVA-105 | 0.142 g |
| (Fully hydrolyzed polyvinyl alcohol from KURARAY CO., LTD., having a degree of saponification of 98.0 to 99.0 mol %, and a viscosity of 5.2 to 6.0 mPa · s (in an aqueous solution of 4% by mass at 20° C.)) | |
| Poly[vinylpyrrolidone/vinyl acetate (1/1)] (molecular weight: 70,000) | 0.001 g |
| Surfactant (EMALEX 710 from Nihon Emulsion Co., Ltd.) | 0.002 g |
| Water | 13 g |

Examples 1 to 42, and 70 to 75, and Comparative Examples 1 to 8

Development Via Photopolymerization Using a Weakly Alkaline Developer

Examples 43 to 47, and Comparative Examples 9 to 11

Development Via Photopolymerization Using a Strongly Alkaline Developer (1) Exposure, Development and Printing The lithographic printing plate precursors described above were imagewise exposed using Violet semiconductor laser platesetter Vx9600 (incorporating an InGaN semiconductor laser (emission wavelength 405 nm±10 nm/output 30 mW)) from FUJIFILM Electronic Imaging Ltd. Imaging was performed at an intended 50% tint using an FM screen (TAF-FETA 20) from Fujifilm Corporation at a resolution of 2438 dpi and a surface exposure dose of 0.05 mJ/cm$^2$.

Then, the plate precursors were preheated at 100° C. for 10 seconds, and then the image was developed using developer 1 having the composition shown below in an automatic developing machine having a structure as shown in FIG. 1 at a feed speed that allows an immersion time in the developer (developing time) of 20 seconds. When developer 2 was used, the plate precursors were washed with water before the drying after development.

Then, lithographic printing plates obtained after development were mounted on the printing press SOR-M from Heidelberg Printing Machines AG to perform printing with a dampening water (EU-3 (an etching solution from Fujifilm Corporation)/water/isopropyl alcohol=1/89/10 (volume ratio)) and TRANS-G(N) black ink (from DIC Corporation) at a printing speed of 6000 sheets/hr.

<Developer 1>

| | |
|---|---|
| Water | 88.6 g |
| Nonionic surfactant (W-1) | 2.4 g |
| Nonionic surfactant (W-2) | 2.4 g |
| Nonionic-surfactant | 1.0 g |
| (EMALEX 710 from Nihon Emulsion Co., Ltd.) | |
| Phenoxypropanol | 1.0 g |
| Octanol | 0.6 g |
| N-(2-hydroxyethyl)morpholine | 1.0 g |
| Triethanolamine | 0.5 g |
| Sodium gluconate | 1.0 g |
| Trisodium citrate | 0.5 g |
| Tetrasodium ethylenediaminetetraacetate | 0.05 g |
| Polystyrene sulfonate | 1.0 g |
| (Versa TL77 (a 30 % solution) from Alco Chemical) | |

*The developer having the composition shown above was adjusted to pH 7.0 by adding phosphoric acid.

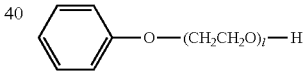

$l = 13\text{-}28$ (W-1)

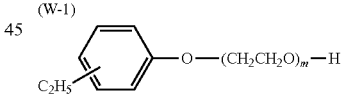

$m = 12\text{-}26$ (W-2)

<Developer 2>

| | |
|---|---|
| Potassium hydroxide | 0.15 g |
| Newcol B13 (from NIPPON NYUKAZAI CO., LTD.) | 5.0 g |
| Chelest 400 (chelating agent) (from CHELEST CORPORATION) | 0.1 g |
| Distilled water | 94.75 g |
| (pH: 12.05) | |

The lithographic printing plates obtained were mounted on the printing press SOR-M from Heidelberg Printing Machines AG to perform printing with a dampening water (EU-3 (an etching solution from Fujifilm Corporation)/water/isopropyl alcohol=1/89/10 (volume ratio)) and TRANS-G (N) black ink (from DIC Corporation) at a printing speed of 6000 sheets/hr.

[Evaluation]

Each lithographic printing plate precursor was evaluated for printing durability, developer running performance, and water window as described below. The results are shown in the table below.

<Printing Durability>

As the number of prints increased, the ink density on printing paper decreased because the photosensitive layer gradually wore and lost its ink receptivity. In each printing plate exposed at the same exposure dose, printing durability was evaluated by determining the number of prints when the ink density (reflection density) decreased by 0.1 as compared with the density at the start of printing.

<Developer Running Performance>

The developing described above was repeated without replacing the developer, and the cyan density in non-image areas of the resulting lithographic printing plate was measured by a MacBeth densitometer. Under the development conditions described above, the test was repeated until the cyan density was no longer equal to the cyan density in the aluminum support to evaluate developer running performance by determining the total area of the printing plate precursor treated until that time.

<Water Window>

Printing was performed with varying feed levels of the dampening water (at a scale of 0 to 100) during printing to evaluate water window by determining the maximum value minus the minimum value on the scale within which good images were obtained.

TABLE 5

| Example number | Solution for photosensitive layers | Developer | Printing durability piece | Developer running performance m2 | Water window scale |
|---|---|---|---|---|---|
| 1 | 1 | 1 | 55,000 | 350 | 14 |
| 2 | 2 | 1 | 56,000 | 360 | 13 |
| 3 | 3 | 1 | 50,000 | 270 | 10 |
| 4 | 4 | 1 | 50,000 | 300 | 11 |
| 5 | 5 | 1 | 51,000 | 300 | 12 |
| 6 | 6 | 1 | 50,000 | 290 | 10 |
| 7 | 7 | 1 | 48,000 | 310 | 10 |
| 8 | 8 | 1 | 49,000 | 300 | 10 |
| 9 | 9 | 1 | 60,000 | 400 | 16 |
| 10 | 10 | 1 | 62,000 | 400 | 20 |
| 11 | 11 | 1 | 59,000 | 400 | 19 |
| 12 | 12 | 1 | 61,000 | 420 | 20 |
| 13 | 13 | 1 | 63,000 | 410 | 19 |
| 14 | 14 | 1 | 59,000 | 400 | 20 |
| 15 | 15 | 1 | 62,000 | 430 | 20 |
| 16 | 16 | 1 | 61,000 | 430 | 17 |
| 17 | 17 | 1 | 58,000 | 420 | 20 |
| 18 | 18 | 1 | 60,000 | 410 | 17 |
| 19 | 19 | 1 | 61,000 | 410 | 20 |
| 20 | 20 | 1 | 60,000 | 400 | 19 |
| 21 | 21 | 1 | 67,000 | 470 | 22 |
| 22 | 22 | 1 | 65,000 | 460 | 21 |
| 23 | 23 | 1 | 66,000 | 450 | 21 |
| 24 | 24 | 1 | 67,000 | 460 | 23 |
| 25 | 25 | 1 | 68,000 | 450 | 21 |
| 26 | 26 | 1 | 69,000 | 470 | 22 |
| 27 | 27 | 1 | 75,000 | 510 | 25 |
| 28 | 28 | 1 | 78,000 | 500 | 26 |
| 29 | 29 | 1 | 76,000 | 530 | 26 |
| 30 | 30 | 1 | 78,000 | 500 | 24 |
| 31 | 31 | 1 | 74,000 | 500 | 25 |
| 32 | 32 | 1 | 75,000 | 510 | 24 |
| 33 | 33 | 1 | 75,000 | 500 | 25 |
| 34 | 34 | 1 | 77,000 | 500 | 26 |
| 35 | 35 | 1 | 75,000 | 500 | 24 |
| 36 | 36 | 1 | 78,000 | 500 | 25 |
| 37 | 37 | 1 | 76,000 | 510 | 24 |
| 38 | 38 | 1 | 79,000 | 520 | 26 |
| 39 | 39 | 1 | 76,000 | 520 | 26 |
| 40 | 40 | 1 | 79,000 | 510 | 25 |
| Comparative example 1 | 41 | 1 | 40,000 | 120 | 8 |
| Comparative example 2 | 42 | 1 | 37,000 | 100 | 8 |
| Comparative example 3 | 43 | 1 | 39,000 | 110 | 8 |
| Comparative example 4 | 44 | 1 | 35,000 | 80 | 7 |
| Comparative example 5 | 45 | 1 | 30,000 | 70 | 5 |
| Comparative example 6 | 46 | 1 | 29,000 | 80 | 5 |
| 41 | 49 | 1 | 65,000 | 400 | 17 |
| 42 | 50 | 1 | 60,000 | 300 | 16 |
| Comparative example 7 | 51 | 1 | 20,000 | 120 | 4 |
| Comparative example 8 | 52 | 1 | 29,000 | 70 | 8 |
| 70 | 61 | 1 | 70,000 | 490 | 24 |
| 71 | 62 | 1 | 65,000 | 480 | 24 |
| 72 | 63 | 1 | 64,000 | 480 | 24 |
| 73 | 64 | 1 | 70,000 | 500 | 24 |
| 74 | 65 | 1 | 70,000 | 500 | 25 |
| 75 | 66 | 1 | 72,000 | 510 | 24 |

The table above shows that when the lithographic printing plate precursors of the present invention were used, the resulting printing plates were excellent in all of printing durability, developer running performance and water window scale. This phenomenon was especially effective when a compound containing a urethane bond was included as a polymerizable compound, and more effective when a compound containing a urea bond was included. However, the advantages of the present invention could not be achieved when a polyvinyl acetal resin containing a crosslinkable group other than a (meth)acryloyl group was used (Comparative examples 4, 5) or when an alkylene group existed between the main chain and a (meth)acryloyl group even if it was used (Comparative examples 1 to 3). Further, the advantages of the present invention could not be obtained when a polyvinyl acetal resin not containing a crosslinkable group was used (Comparative example 6), or when an acrylic resin was not contained (Comparative example 7), or when a polyvinyl acetal resin was not used (Comparative example 8).

TABLE 6

| Example number | Solution for photosensitive layers | Developer | Printing durability piece | Developer running performance m2 | Water window scale |
|---|---|---|---|---|---|
| 43 | 1 | 2 | 54,000 | 340 | 13 |
| 44 | 3 | 2 | 50,000 | 280 | 10 |
| 45 | 9 | 2 | 63,000 | 410 | 16 |
| 46 | 21 | 2 | 67,000 | 460 | 21 |
| 47 | 27 | 2 | 75,000 | 520 | 24 |
| Comparative example 9 | 41 | 2 | 35,000 | 110 | 8 |
| Comparative example 10 | 51 | 2 | 20,000 | 110 | 5 |
| Comparative example 11 | 52 | 2 | 25,000 | 70 | 7 |

The table above shows that when the lithographic printing plate precursors of the present invention were used, the resulting printing plates were excellent in all of printing durability, developer running performance and water window scale not only in cases where a weakly alkaline developer was used but also in cases a strongly alkaline developer was used.

Examples 53 to 62, and Comparative Examples 15 to 20

Thermal Development Using a Weakly or Strongly Alkaline Developer

[Exposure, Development and Printing]

Various lithographic printing plate precursors shown below were imagewise exposed at an intended 50% tint using Trendsetter 3244VX (incorporating a water-cooled 40 W infrared semiconductor laser (830 nm)) from Creo under conditions of an output power of 9 W, an external drum rotational speed of 210 rpm, and a resolution of 2,400 dpi. Then, the image was developed using each developer in an automatic developing machine having the structure shown in FIG. 2 with heater settings that allow the plate surface to reach a temperature of 100° C. in the preheating section and at a feed speed that allows an immersion time in the developer (developing time) of 20 seconds. When developer 2 was used, the plate precursors were washed with water before the drying after development.

The lithographic printing plates obtained were mounted on the printing press SOR-M from Heidelberg Printing Machines AG to perform printing with a dampening water (EU-3 (an etching solution from Fujifilm Corporation)/water/isopropyl alcohol=1/89/10 (volume ratio)) and TRANS-G (N) black ink (from DIC Corporation) at a printing speed of 6000 sheets/hr.

Each lithographic printing plate precursor was evaluated for printing durability, developer running performance, and water window in the same manner as in Example 1. The results are shown in the table below.

TABLE 7

| Example number | Solution for photosensitive layers | Developer | Printing durability piece | Developer running performance m2 | Water window scale |
|---|---|---|---|---|---|
| 53 | 53 | 1 | 55,000 | 360 | 13 |
| 54 | 54 | 1 | 51,000 | 300 | 11 |
| 55 | 55 | 1 | 62,000 | 420 | 19 |
| 56 | 56 | 1 | 66,000 | 450 | 21 |
| 57 | 57 | 1 | 75,000 | 500 | 23 |
| Comparative example 15 | 58 | 1 | 37,000 | 100 | 8 |
| Comparative example 16 | 59 | 1 | 30,000 | 80 | 8 |
| Comparative example 17 | 60 | 1 | 29,000 | 70 | 4 |
| 58 | 53 | 2 | 54,000 | 360 | 12 |
| 59 | 54 | 2 | 50,000 | 290 | 11 |
| 60 | 55 | 2 | 60,000 | 420 | 19 |
| 61 | 56 | 2 | 65,000 | 450 | 20 |
| 62 | 57 | 2 | 72,000 | 500 | 22 |
| Comparative example 18 | 58 | 2 | 35,000 | 100 | 9 |
| Comparative example 19 | 59 | 2 | 30,000 | 80 | 8 |
| Comparative example 20 | 60 | 2 | 2,000 | 70 | 5 |

The table above shows that when the lithographic printing plate precursors of the present invention were used, the resulting printing plates were excellent in all of printing durability, developer running performance and water window scale even after thermal development.

Examples 48 to 52, and Comparative Examples 12 to 14

On-Press Thermal Development

[Exposure, Development and Printing]

Various lithographic printing plate precursors shown in the table below were exposed using Luxel PLATESETTER T-6000III incorporating an infrared semiconductor laser from Fujifilm Corporation, under conditions of an external drum rotational speed of 1000 rpm, a laser output of 70%, and a resolution of 2400 dpi. The image formed by exposure included solid areas and halftone areas produced by 20 μm dot FM screening.

The exposed lithographic printing plate precursors were mounted on the plate cylinder of the printing press LITHRONE 26 from KOMORI Corporation without developing the image. The image was developed on press with a dampening water consisting of Ecolity-2 (from Fujifilm Corporation)/tap water=2/98 (volume ratio) and Values-G(N) black ink (from DIC Corporation) by supplying the dampening water and the ink according to the standard automatic print starting mode of LITHRONE 26, followed by printing on 100 sheets of Tokubishi Art paper (76.5 kg) at a printing speed of 10000 sheets/hr.

[Evaluation]

Each lithographic printing plate precursor was evaluated for printing durability, and water window scale in the same manner as in Example 1.

Further, developer running performance was evaluated as follows. On-press development was repeated without replacing the dampening water. Under the development conditions described above, the test was repeated until the on-press development was no longer finished within the number of prints taken for the on-press development using the dampening water immediately after it was replaced to evaluate developer running performance by determining the total area of the printing plate precursor treated until that time. The evaluation was as follows. The results are shown in the table below.

TABLE 8

| Example number | Solution for photosensitive layers | Printing durability piece | Developer running performance m2 | Water window scale |
|---|---|---|---|---|
| 48 | 53 | 56,000 | 360 | 13 |
| 49 | 54 | 50,000 | 300 | 11 |
| 50 | 55 | 59,000 | 420 | 19 |
| 51 | 56 | 67,000 | 450 | 21 |
| 52 | 57 | 75,000 | 500 | 23 |
| Comparative example 12 | 58 | 34,000 | 100 | 8 |
| Comparative example 13 | 59 | 25,000 | 80 | 8 |
| Comparative example 14 | 60 | 20,000 | 70 | 4 |

The table above shows that when the lithographic printing plate precursors of the present invention were used, the resulting printing plates were excellent in all of printing durability, developer running performance and water window scale even after on-press thermal development.

The invention claimed is:

1. A lithographic printing plate precursor comprising a photosensitive layer on a support, wherein the photosensitive layer comprises at least one polymerizable compound (A) which has at least one ethylenic unsaturated double bond, a polymerization initiator (B), a polyvinyl acetal binder (C) containing at least one repeating unit selected from the group consisting of repeating units represented by general formula (I-c), general formula (I-b) and general formula (I-a), and an acrylic resin binder (D):

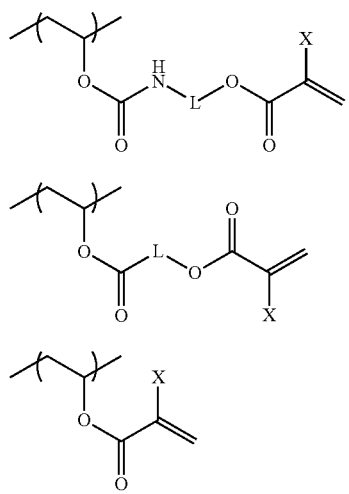

in the formulae above, each X represents a hydrogen atom or a methyl group, and each L represents a divalent linking group; and the weight ratio between the polyvinyl acetal binder (C) and the acrylic resin binder (D) is 1:1 to 6:1.

2. The lithographic printing plate precursor according to claim 1, wherein the binder (C) is a polyvinyl acetal binder containing at least one repeating unit selected from the group consisting of repeating units represented by general formula (II), general formula (III), general formula (IV) and general formula (V) below:

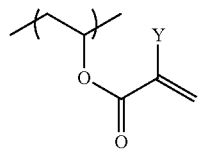

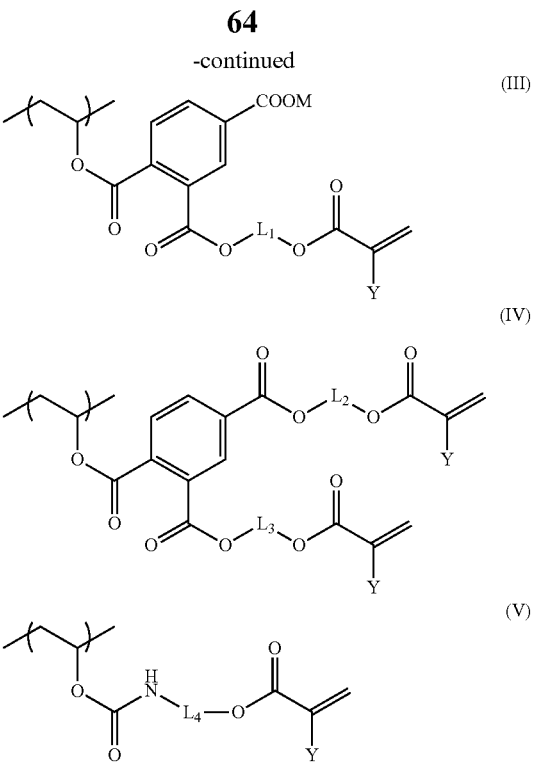

in the formulae above, each Y represents a hydrogen atom or a methyl group, M represents a hydrogen atom, a lithium atom, a sodium atom or a potassium atom, and $L^1$ to $L^4$ each represents an optionally substituted alkyl group, an optionally substituted alkylene group, or an optionally substituted aryl group.

3. The lithographic printing plate precursor according to claim 1, wherein the at least one polymerizable compound (A) contains a urethane bond.

4. The lithographic printing plate precursor according to claim 1, wherein the at least one polymerizable compound (A) further contains a urea bond.

5. The lithographic printing plate precursor according to claim 1, wherein the at least one polymerizable compound (A) is a (meth)acrylate containing a urethane bond and/or urea bond.

6. The lithographic printing plate precursor according to claim 1, wherein the at least one polymerizable compound (A) is a polyfunctional compound.

7. The lithographic printing plate precursor according to claim 1, wherein at least one of the at least one polymerizable compound (A) is a compound represented by the formula below:

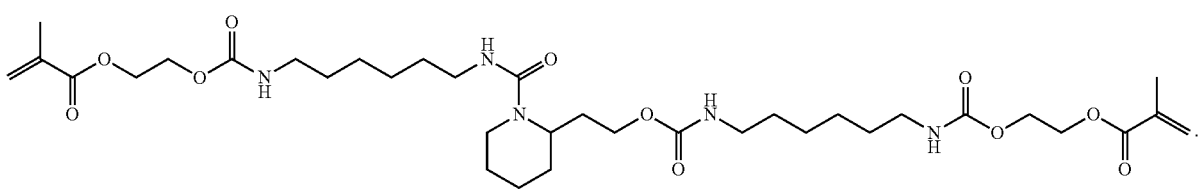 [SMILES: C=C(C)C(=O)OCCOC(=O)NCCCCCCNC(=O)OCCC1CCCCN1C(=O)NCCCCCCNC(=O)OCCOC(=O)C(=C)C]

8. The lithographic printing plate precursor according to claim 1, wherein the polyvinyl acetal binder is a polyvinyl acetal binder containing each of the repeating units (1) to (3) shown below, an acid group, and at least one repeating unit selected from the group consisting of repeating units represented by general formula (I-c), general formula (I-b) and general formula (I-a):

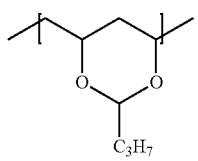

(1)

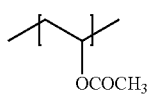

(2)

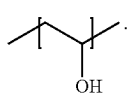

(3)

9. The lithographic printing plate precursor according to claim 2, wherein the at least one polymerizable compound (A) contains a urethane bond.

10. The lithographic printing plate precursor according to claim 2, wherein the at least one polymerizable compound (A) further contains a urea bond.

11. The lithographic printing plate precursor according to claim 2, wherein the at least one polymerizable compound (A) is a (meth)acrylate containing a urethane bond and/or urea bond.

12. The lithographic printing plate precursor according to claim 2, wherein the at least one polymerizable compound (A) is a polyfunctional compound.

13. The lithographic printing plate precursor according to claim 2, wherein at least one of the at least one polymerizable compound (A) is a compound represented by the formula below:

14. The lithographic printing plate precursor according to claim 2, wherein the polyvinyl acetal binder is a polyvinyl acetal binder containing each of the repeating units (1) to (3) shown below, an acid group, and at least one repeating unit selected from the group consisting of repeating units represented by general formula (I-c), general formula (I-b) and general formula (I-a):

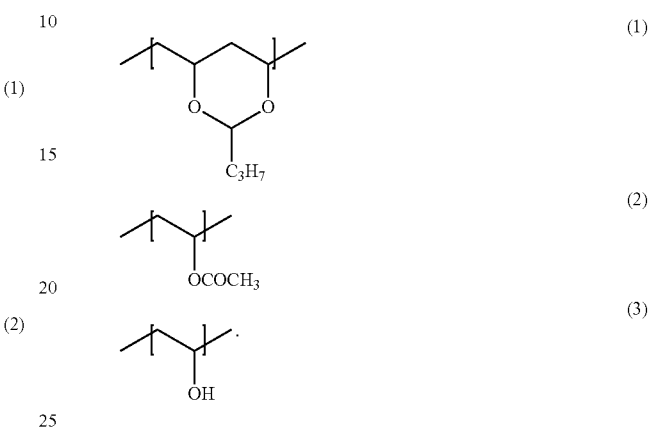

15. A process for preparing a lithographic printing plate, comprising: imagewise-exposing a lithographic printing plate precursor according to claim 1; and developing the exposed lithographic printing plate precursor in the presence of a developer at pH 2 to 14 to remove the photosensitive layer in non-exposed areas.

16. The process for preparing a lithographic printing plate according to claim 15, wherein the exposing comprises heating the exposed precursor at a temperature of 80° C. or more in a preheating unit.

17. The process for preparing a lithographic printing plate according to claim 15, wherein the lithographic printing plate precursor comprises a protective layer on the surface of the photosensitive layer opposite to the support; and
the developing comprises removing the photosensitive layer in non-exposed areas and the protective layer simultaneously in the presence of the developer further containing a surfactant provided that no water-washing is included.

18. The process for preparing a lithographic printing plate according to claim 15, comprising controlling the pH of the developer at 2.0 to 10.0.

19. A process for preparing a lithographic printing plate, comprising: imagewise-exposing a lithographic printing plate precursor according to claim 1; and supplying a printing ink and a dampening water to remove the photosensitive layer in non-exposed areas on a printing press.

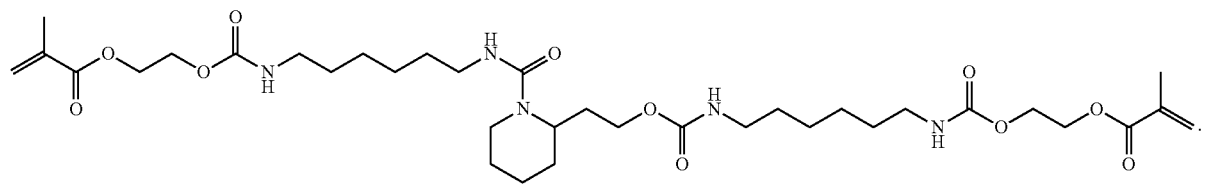 [SMILES: C=C(C)C(=O)OCCOC(=O)NCCCCCCNC(=O)OCCC1CCCCN1C(=O)NCCCCCCNC(=O)OCCOC(=O)C(=C)C]

20. The lithographic printing plate precursor according to claim 1, wherein the content of binder polymers is 5 to 75% by mass based on the total solids of the photosensitive layer.

* * * * *